(12) United States Patent
Kano et al.

(10) Patent No.: US 7,739,789 B2
(45) Date of Patent: Jun. 22, 2010

(54) METHOD FOR FORMING SURFACE GRAFT, CONDUCTIVE FILM AND METAL PATTERNS

(75) Inventors: Takeyoshi Kano, Kanagawa (JP);
Koichi Kawamura, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 358 days.

(21) Appl. No.: 10/594,227

(22) PCT Filed: Mar. 24, 2005

(86) PCT No.: PCT/JP2005/006218
§ 371 (c)(1),
(2), (4) Date: Sep. 25, 2006

(87) PCT Pub. No.: WO2005/090454
PCT Pub. Date: Sep. 29, 2005

(65) Prior Publication Data
US 2007/0212883 A1    Sep. 13, 2007

(30) Foreign Application Priority Data
Mar. 24, 2004  (JP) .............................. 2004-087980
Jun. 1, 2004   (JP) .............................. 2004-163783

(51) Int. Cl.
*H05K 3/02* (2006.01)
(52) U.S. Cl. .............................. 29/846; 29/825; 29/832; 29/847; 29/877
(58) Field of Classification Search .................. 29/825, 29/832, 846, 847, 877
See application file for complete search history.

(56) References Cited

U.S. PATENT DOCUMENTS

| | | | |
|---|---|---|---|
| 3,720,635 A * | 3/1973 | Metzner et al. ................ 522/33 |
| 3,867,759 A * | 2/1975 | Siefker ......................... 29/830 |
| 4,347,111 A * | 8/1982 | Gehlhaus et al. ............... 522/8 |
| 5,500,315 A * | 3/1996 | Calvert et al. ................ 430/16 |
| 5,587,209 A | 12/1996 | Soga et al. |
| 6,284,072 B1 * | 9/2001 | Ryan et al. ..................... 156/59 |
| 6,951,604 B2 * | 10/2005 | Katayama et al. ........... 205/169 |
| 7,438,950 B2 * | 10/2008 | Kano et al. .................. 427/304 |
| 2002/0045033 A1 * | 4/2002 | Uhara et al. ................. 428/195 |
| 2003/0165633 A1 * | 9/2003 | Ryu et al. .................... 427/535 |
| 2004/0009683 A1 * | 1/2004 | Hiraoka et al. ................ 439/75 |
| 2004/0069649 A1 * | 4/2004 | Katayama et al. ........... 205/125 |
| 2004/0211979 A1 * | 10/2004 | Shioiri et al. ................ 257/199 |
| 2005/0112369 A1 * | 5/2005 | Ibbitson et al. ............. 428/344 |
| 2006/0237717 A1 * | 10/2006 | Bai et al. ....................... 257/40 |

FOREIGN PATENT DOCUMENTS

| JP | 58-196238 A |   | 11/1983 |
| JP | 05110247 A | * | 4/1993 |

OTHER PUBLICATIONS

Improved Adhesion between Kapton Film and Copper Metal by Plasma Graft Polymerization of Vinylimidazole by N. Inagaki et al Macromolecule, 1996 1642-1648.*

* cited by examiner

*Primary Examiner*—C. J Arbes
(74) *Attorney, Agent, or Firm*—Sughrue Mion, PLLC

(57) ABSTRACT

The present invention provides a method for forming a surface graft, comprising the process of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a polar group, and a surface graft material obtained thereby. The present invention also provides a method for forming a conductive film, comprising the processes of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a polar group, and causing a conductive material to adhere to the graft polymer, and a conductive material obtained thereby.

20 Claims, No Drawings

METHOD FOR FORMING SURFACE GRAFT, CONDUCTIVE FILM AND METAL PATTERNS

FIELD OF THE INVENTION

The present invention relates to a method for forming a surface graft, a method for forming a conductive film, a method for forming a metal pattern for further processing the conductive film obtained by the method, a method for forming a multilayer wiring board having a plurality of metal layers, a surface graft material, and a conductive material.

More particularly, the invention relates to a method for forming a surface graft in which a graft polymer useful for modifying the surface of a polyimide substrate can be generated by a simple process, a method for forming a conductive film in which a conductive film having a high heat resistance and exhibiting excellent adhesion to and durability on the surface of the polyimide substrate can be formed by a simple process, a method for forming a metal pattern, a method for forming a multilayer wiring board, and a surface graft material and a conductive material obtained by the methods. Particularly, the method for forming the metal pattern is useful for forming a printed wiring board (FPC and TAB or the like).

DESCRIPTION OF THE RELATED ART

Polyimide is a polymer compound having extremely high heat stability, and has been applied to various materials requiring heat resistance. Particularly, a circuit board or the like is typically required to have a heat resistance of about 250° C. for solder tolerance, and a polyimide substrate is generally used therefor.

Presently, among metal wiring, fields in which the wiring width is narrow and demand for flow of high frequency current is rising are the FPC and TAB fields.

The FPC (Flexible Printed Circuit) is a wiring board in which a metal pattern is formed on a flexuous substrate, and is used in the head portion which operates at high speed repeatedly in a hard disk drive or an optical pickup by taking advantage of its high flexuous capability. Since an electronic circuit can be incorporated in a narrow space by folding the FPC, the FPC is used in cameras and mobile phones or the like.

"TAB" in TAB tape stands for "Tape Automated Bonding", TAB tape being a wiring board enabling thin-type mounting of an IC-LSI using a heat resistant film for a base substrate. As a mounting method, a lead and a semiconductor chip formed on the wiring board are directly and entirely bonded by hot pressing. The TAB tape is excellent in the high density of the wiring, and is used for a substrate for drivers used in LCD and PDP or the like, for memory and interposers (rewiring boards) for CSP such as a DSP device.

In a typical technique for forming a circuit board using a polyimide substrate, a copper foil with adhesive is laminated on one surface of the polyimide substrate, and wiring of a predetermined pattern is formed by selective etching of the copper foil. However, since the heat resistance of the adhesive for adhering the copper to the substrate is low in the technique, a problem exists in that the heat resistance of the circuit board is low, and thereby a copper board which uses no adhesive is required.

Therefore, recently, as disclosed in Japanese Patent Application Laid-Open (JP-A) No. 2002-93965, a technique which uses no adhesive has been developed, in which a copper layer is formed on a polyimide substrate by sputtering a metal layer on the polyimide substrate followed by plating. However, since adhesive is not used in the technique, a problem exists in that there is weak adhesion of the copper to the substrate. In order to solve the problem, a method is proposed by En Tang Kang, Yan Zhang in "Advanced Materials", 20, pp. 1481-1494, and N. Inagaki, S. Tasaka, M. Masumoto in "Macromolecules", 29, pp. 1642-1648. The method improves the adhesion of the copper layer to the polyimide substrate by carrying out plasma polymerization at the polyimide substrate, introducing a polymerization initiator group onto the surface of the polyimide substrate, polymerizing a monomer from the polymerization initiator group, and introducing a surface graft polymer onto the surface of the polyimide substrate to perform a surface treatment. However, since the large-scale treatment such as plasma treatment is required in these techniques, a simpler technique is sought after.

As described above, a technique for making a surface modification such as endowment of conductivity more simplified is desired of polyimide substrates that have excellent heat resistance. However, at present this has not yet been provided.

SUMMARY OF THE INVENTION

The present invention has been made in view of the above-described circumstances and provides a method for forming a surface graft which can generate a graft polymer useful for modifying the surface of a polyimide substrate by using a simple process, and a surface graft material obtained by the method for forming a surface graft.

The present invention also provides a method for forming a conductive film which can form a conductive film which has high heat resistance and exhibits excellent adhesion to and durability on the surface of the polyimide substrate by using a simple process, a conductive material obtained by the method for forming the conductive film, a method for forming a metal pattern formed by using the conductive film having the above characteristics, and a method for forming a multilayer wiring board.

The inventors found that active points (radicals) can be easily generated on the surface of a polyimide substrate by energy application of UV light or the like without having to use powerful active light rays such as of plasma, by using a polyimide in which a polymerization initiating moiety is introduced to the skeleton thereof as the substrate. It was also found that the surface of the polyimide substrate can be simply modified by generating a graft polymer that is directly bonded to the surface of the substrate and that has a polar group, starting from the active points. Thereby completion of the invention was reached.

That is, the method for forming the surface graft of the invention comprises the process of applying energy to the surface of a substrate containing a polyimide having a polymerization initiating moiety in the skeleton thereof, to generate active points on the surface of the substrate and to generate a graft polymer that is directly bonded to the surface of the substrate starting from the active points and that has a polar group.

The method for forming the conductive film of the invention includes the following first to third aspects.

That is, in accordance with the first aspect of the invention, there is provided a method for forming a conductive film, comprising the processes of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a polar group, and causing a conductive material to adhere to the graft polymer.

In the first aspect, it is preferable that the method for forming the conductive film, further comprises the process of heating after the process of adhering the conductive material to the graft polymer.

In accordance with a second aspect of the invention, there is provided a method for forming a conductive film, comprising the processes of applying energy to the surface of a substrate containing polyimide having a polymerization initiating moiety in the skeleton thereof, to generate active points on the surface of the substrate and to generate a graft polymer that is directly bonded to the surface of the polyimide substrate starting from the active points and that has a polar group, applying a metal ion or a metal salt to the graft polymer; and reducing the metal ion or a metal ion in the metal salt to deposit metal fine particles.

In the second aspect, it is preferable that the method for forming the conductive film further comprises the process of heating after the process of reducing the metal ion or the metal ion in the metal salt to deposit metal fine particle.

In accordance with a third aspect of the invention, there is provided a method for forming a conductive film, comprising the processes of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a functional group interacting with an electroless plating catalyst or the precursor thereof; applying the electroless plating catalyst or the precursor thereof to the graft polymer; and carrying out electroless plating. The process of carrying out electroplating may be executed after the process of carrying out electroless plating.

Although the conductive film may be formed on only one surface of the substrate, the conductive film can also be formed on both surfaces of the substrate containing polyimide having the polymerization initiating moiety in the skeleton thereof when the substrate is a film-like or tabular substrate. Thereby, when the conductive film is applied to the circuit wiring or the like, more wirings per one substrate can be formed.

A surface graft material of the invention has a substrate containing polyimide having a polymerization initiating moiety in the skeleton thereof and a graft polymer directly bonded to the surface of the substrate.

The conductive material of the invention has a substrate containing the polyimide having the polymerization initiating moiety in the skeleton thereof, a graft polymer directly bonded to the surface of the surface of the substrate, and a conductive material adhered to the graft polymer.

In the invention, the metal pattern exhibiting excellent adhesion can be formed by carrying out an etching process on the conductive film obtained by the method for forming the conductive film.

The conductive film and the metal pattern according to the invention may be a single layer, and may be formed on both surfaces of the substrate in the case of a film-like or tabular substrate.

In the case of forming a multilayer wiring board which has a plurality of metal layers such as a plurality of conductive films and metal patterns that include the metal patterns obtained by the above method and an insulating layer(s) disposed therebetween, a drilling process for forming an opening in the insulating layer can be carried out so as to connect the plurality of metal layers electrically. In the case of electrically connecting the metal pattern formed on both surfaces of the substrate, the substrate itself means "insulating layer" herein. As other aspects, when a multilayer structure due to the metal layers is formed by laminating sequentially an insulated material layer and a metal layer or the like to form the multilayer wiring board after the metal layer is formed on one substrate, the opening may be formed in the insulated material layer existing between the metal layers, i.e., "insulating layer".

Next, a conductive process for electrically connecting the plurality of metal layers by endowing conductivity to the opening formed in the process is carried out. The drilling process and the conductive process can provide openings such as through holes in the insulating layer represented by the substrate, and can attain the electric connection between the multilayer metal wirings. The electric connection between the multilayer metal wirings is useful in case of the high density of the wiring formed on the substrate to which the metal pattern to be obtained by the invention is applied, and the mounting parts are mounted in high density.

In the invention, the rustproof process can be carried out to the conductive film and metal pattern obtained if desired.

According to the invention, the method for forming the surface graft which can produce the graft polymer useful for the surface modification of the polyimide substrate in a simple process, and the surface graft material obtained by the method for forming the surface graft can be provided.

According to the invention, the method for forming the conductive film which can form the conductive material which has a high heat resistance and exhibits excellent adhesion property and durability to the surface of the polyimide substrate in the simple process, and the conductive film obtained by the method for forming the conductive film can be provided.

According to the invention, the metal pattern material which has the high heat resistance and exhibits excellent adhesion property and durability to the surface can be obtained on the surface of the polyimide substrate. Since the graft polymer introduced on the substrate is connected with the substrate at the end of a polymer chain and has a structure having an extremely high motility in the formation of the metal pattern, the permeability of the conductive material is excellent and the conductive material is excellent in the adhesion. In addition, in the etching process, an etching solution can easily diffuse in the graft polymer layer, and the metal component existing on the surface of the substrate is easily removed.

The material on which the metal pattern is formed by applying the invention may be used as a circuit board or the like, as it is, and may be used as the multilayer wiring board or the like by laminating a plurality of materials. The material is applied to the wide range. For example, the invention is particularly useful for the formation of various electric elements such as a FPC board (one surface, both surfaces, multilayer), a TAB tape and a semiconductor package which are required for minute wiring.

DESCRIPTION OF THE PREFERABLE EMBODIMENTS

Hereinafter, the present invention will be explained in detail.

1. Method for Forming a Surface Graft

A method for forming a surface graft of the invention comprises the process of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a polar group.

Hereinafter, each constituent element in the method for forming the surface graft of the invention will be explained in detail.

[Preparation of a Substrate Containing Polyimide Having a Polymerization Initiating Moiety in the Skeleton Thereof]

The substrate of the invention is the substrate (hereinafter, may be referred simply to as "polyimide substrate") containing the polyimide having the polymerization initiating moiety in the skeleton thereof. The "polymer skeleton" in the invention includes the main chain and side chain(s) of the polyimide. In view of obtaining heat resistance, the polyimide preferably has the polymerization initiating moiety in main chain thereof.

Herein, the polymerization initiating moiety means a part which is activated by the energy application due to UV light or the like and can generate the active points (radical kind) in the structure. Examples of the aspects which generates the active points include an aspect which generates the active points at the polymerization initiating moiety directly, and an aspect which causes the generation of the active points at the polymerization initiating moiety and the vicinity by drawing out of hydrogen near the polymerization initiating moiety. The polyimide used as the substrate according to the invention is polyimide (hereinafter, may be referred suitably to as "specific polyimide") containing the polymerization initiating moiety in the skeleton thereof, and the graft polymer to be described later can be simply generated on the surface of the substrate by having the moiety.

In the invention, the polymerization initiating moiety contained in the specific polyimide is most preferably contained in the main chain skeleton of the polyimide from the view point of heat resistance and easy production.

The substrate containing the specific polyimide according to the invention can be produced by carrying out the following items <1> to <3> in this order.

<1> Preparation of a Polyimide Precursor

<2> Forming of a Polyimide Precursor

<3> Change of a Polyimide Precursor to a Polyimide Structure Due to Heat Treatment Hereinafter, the above items <1> to <3> will be explained.

<1> Preparation of a Polyimide Precursor

Explanation of a Polyimide Precursor Compound

As the polyimide precursor compound used for producing the specific polyimide in the invention, a compound represented by the following general formula (I) is used.

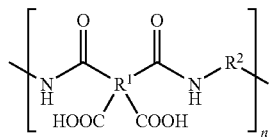

General formula (I)

$R^1$ represents a tetravalent organic group in the general formula (I). $R^2$ represents a divalent organic group, and n represents an integer of 1 or more. At least one of $R^1$ and $R^2$ is a group containing a structure having a polymerization initiating ability. The structure portion having the polymerization initiating ability is a polymerization initiating moiety in the polyimide according to the invention. It is preferable that the structure having polymerization initiating ability is a structure having a photo polymerization initiating ability.

The compound represented by the general formula (I) can be obtained by reacting tetracarboxylic acid dianhydride represented by the following general formula (II) with a diamine compound represented by the following general formula (III) in an organic solvent. Divalent alcohols may be added as other ingredients.

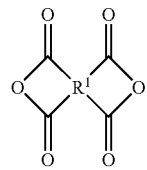

General formula (II)

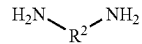

General formula (III)

$R^1$ and $R^2$ in the above general formulae (II) and (III) have the same meanings as $R^1$ and $R^2$ in the general formula (I).

Tetracarboxylic Acid Dianhydride Represented by the General Formula (II)

As tetracarboxylic acid dianhydride represented by the general formula (II), $R^1$ is preferably a compound selected from an aliphatic group having 2 to 27 carbon atoms, a cyclic aliphatic group having 4 to 10 carbon atoms, a monocyclic aromatic group, and a fused polycyclic aromatic group, or a group containing the structure having the polymerization initiating ability. Or $R^1$ is preferably a non-fused polycyclic aromatic group with which the aromatic group is directly connected, or a non-fused polycyclic aromatic group in which the aromatic groups are mutually connected by a bridge member. Among them, it is most preferable that $R^1$ is a group containing the structure having the polymerization initiating ability.

Tetracarboxylic acid dianhydride represented by the general formula (II) may be used singly or in combination.

When $R^1$ in the general formula (II) is the group selected from the aliphatic group having 2 to 27 carbon atoms, the cyclic aliphatic group having 4 to 10 carbon atoms, the monocyclic aromatic group, or the fused polycyclic aromatic group, the monocyclic aromatic group or the fused polycyclic aromatic group is preferable from the view point of heat resistance of the polyimide.

When $R^1$ is the group selected from the aliphatic group having 2 to 27 carbon atoms, the cyclic aliphatic group having 4 to 10 carbon atoms, the monocyclic aromatic group, or the fused polycyclic aromatic group, examples of tetracarboxylic acid dianhydride represented by the general formula (II) include pyromellitic anhydride, 2,3,6,7-tetra-carboxy naphthalene anhydride, 1,4,5,8-tetracarboxy naphthalene anhydride, 1,2,5,6-tetra-carboxy naphthalene anhydride, p-terphenyl-3,4,3'',4''-tetra carboxylic acid anhydride, m-terphenyl-3,4,3'',4''-tetra carboxylic acid anhydride and bicyclo(2,2,2)octo-7-en-2,3,5,6-tetra carboxylic acid anhydride.

When $R^1$ represents the non-fused polycyclic aromatic group with which the aromatic group is directly connected, or the non-fused polycyclic aromatic groups with which are mutually connected through the bridge part, specific examples of tetracarboxylic acid dianhydride represented by the general formula (II) include ethylene tetracarboxylic acid dianhydride, cyclopentane carboxylic acid dianhydride, pyromellitic dianhydride, 3,3,4,4'-biphenyl tetracarboxylic acid dianhydride, 2,2',3,3'-biphenyl tetracarboxylic acid dianhydride, 2,2-bis(3,4'-dicarboxyphenyl) propane dianhydride, 2,2-bis(2,3-dicarboxyphenyl) propane dianhydride, bis(3,4-dicarboxyphenyl)ether dianhydride, bis(3,4-dicarboxyphenyl)sulfone dianhydride, 1,1-bis(2,3-dicarboxyphenyl)ethane dianhydride, bis(2,3-dicarboxyphenyl)methane dianhydride, bis(3,4-dicarboxyphenyl)methane dianhydride, 2,2-bis(3,4-dicarboxyphenyl)-1,1,1,3,3,3-hexafluoro propane dianhydride, 2,2-bis(2,3-dicarboxyphenyl)-1,1,1,3,3,3-hexafluoro propane dianhydride, 2,3,6,7-naphthalenetetracarboxylic acid dianhydride, 1,4,5,8-naphthalenetetracarboxylic acid dianhydride, 1,2,5,6-naphthalenetetracarboxylic acid dianhydride, 1,2,3,4-benzene tetracarboxylic acid dianhydride, 3,4,9,10-perylene tetracarboxylic acid dianhydride, 2,3,6,7-anthracene tetracarboxylic acid dianhydride, and 1,2,7,8-phenanthrene tetracarboxylic acid dianhydride.

Examples of the structures having the polymerization initiating ability which constitutes the group containing the structure having the polymerization initiating ability represented by $R^1$ include (a) aromatic ketones, (b) an onium salt compound, (c) organic peroxide, (d) a thio compound, (e) a hexaaryl biimidazole compound, (f) a ketoxime ester compound, (g) a borate compound, (h) an adinium compound, (i) an active ester compound, (j) a compound having a carbon halogen bond, and (k) a pyridinium compound.

When $R^1$ is the group containing the structure having polymerization initiating ability, as a connection form of two carboxylic acid non-hydrate structures existing in the general formula (II) and $R^1$, the carboxylic acid non-hydrate structure may be a form connecting to any place in the structure having the above polymerization initiating ability, and may be combined through a connection group.

In the structure having the polymerization initiating ability, (a) aromatic ketones are particularly preferable from the view point of the heat resistant of polyimide.

Although the specific examples of (a) the aromatic ketones are described below, the invention is not limited thereto.

(a) Aromatic Ketones

In the invention, examples of (a) aromatic ketones which is preferable as the structure having polymerization initiating ability include a compound having a benzophenone skeleton or thioxanthone skeleton disclosed in "RADIATION CURING IN POLYMER SCIENCE AND TECHNOLOGY" J. P. Fouassier, J. F. Rabek (1993), P77-117. For example, the following compound is mentioned.

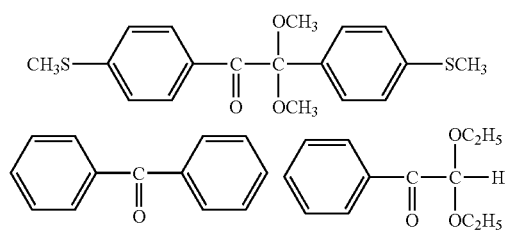

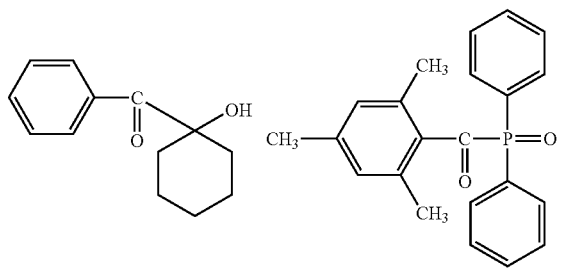

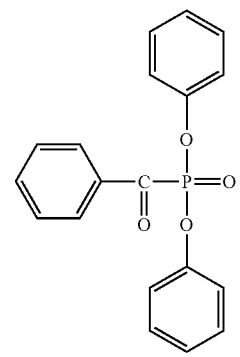

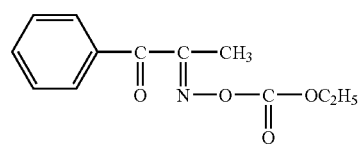

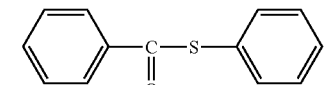

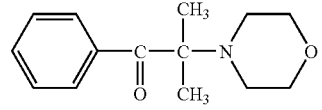

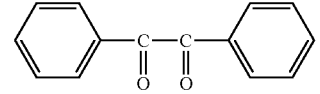

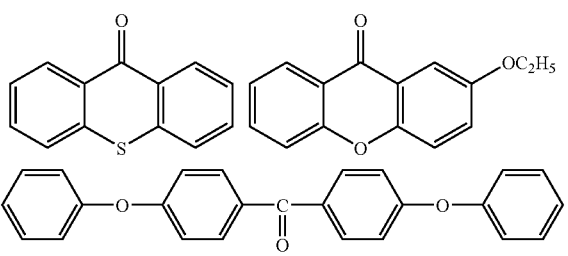

Among them, particularly preferable examples of (a) the aromatic ketones are listed below.

Examples of the aromatic ketones include an alpha-thiobenzophenone compound described in Japanese Patent Application publication (JP-B) No. 47-6416, and a benzoin ether compound described in Japanese Patent Application publication (JP-B) No. 47-3981, for example, the following compound.

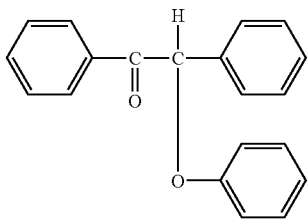

Examples of the aromatic ketones include an alpha-substituted benzoin compound described in Japanese Patent Application publication (JP-B) No. 47-22326, for example, the following compound.

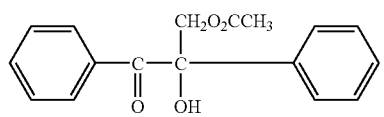

Examples of the aromatic ketones include a benzoin derivative described in Japanese Patent Application publication (JP-B) No. 47-23664, aroyphosphonic acid ester described in Japanese Patent Application Laid-Open (JP-A) No. 57-30704, and dialkoxybenzophenone described in Japanese Patent Application publication (JP-B) No. 60-26483, for example, the following compound.

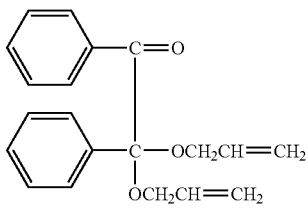

Examples of the aromatic ketones include benzoin ethers described in Japanese Patent Application publication (JP-B) No. 60-26403 and Japanese Patent Application Laid-Open (JP-A) No. 62-81345, for example, the following compound.

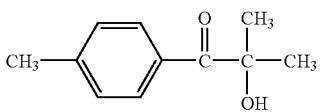

Examples of the aromatic ketones include alpha-aminobenzophenones described in Japanese Patent Application publication (JP-B) No. 1-34242, U.S. Pat. No. 4,318,791, and European Patent Application 0,284,561 A1, for example, the following compound.

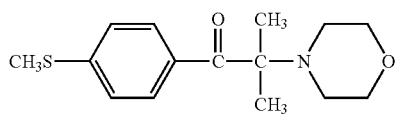

-continued

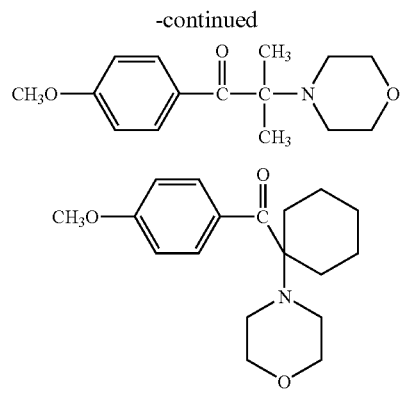

Examples of the aromatic ketones include p-di(dimethylaminobenzoyl)benzene described in Japanese Patent Application Laid-pen (JP-A) No. 2-211452, for example, the following compound.

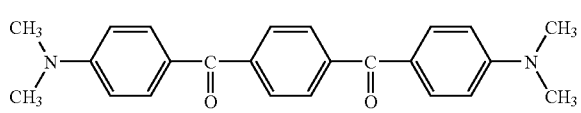

Examples of the aromatic ketones include thio-substituted aromatic ketone described in Japanese Patent Application Laid-pen (JP-A) No. 61-194062, for example, the following compound.

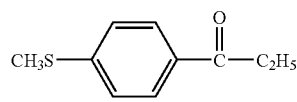

Examples of the aromatic ketones include acylphosphine sulfide described in Japanese Patent Application publication (JP-B) No. 24597, for example, the following compound.

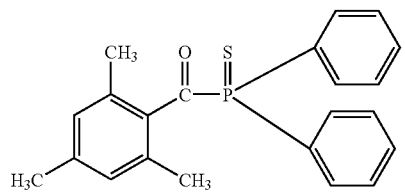

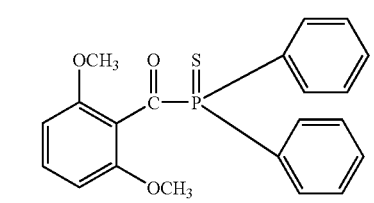

Examples of the aromatic ketones include acylphosphine described in Japanese Patent Application publication (JP-B) No. 2-9596, for example, the following compound.

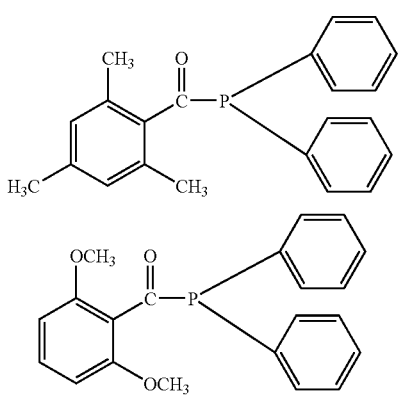

Examples of the aromatic ketones include thioxanthones described in Japanese Patent Application publication (JP-B) No. 63-61950 and coumarins described in Japanese Patent Application publication (JP-B) No. 59-42864.

Although specific examples of tetracarboxylic acid dianhydride which is represented by the general formula (II) and is a particularly preferable aspect, and whose $R^1$ is the polymerization initiator group are shown below, the invention is not limited thereto.

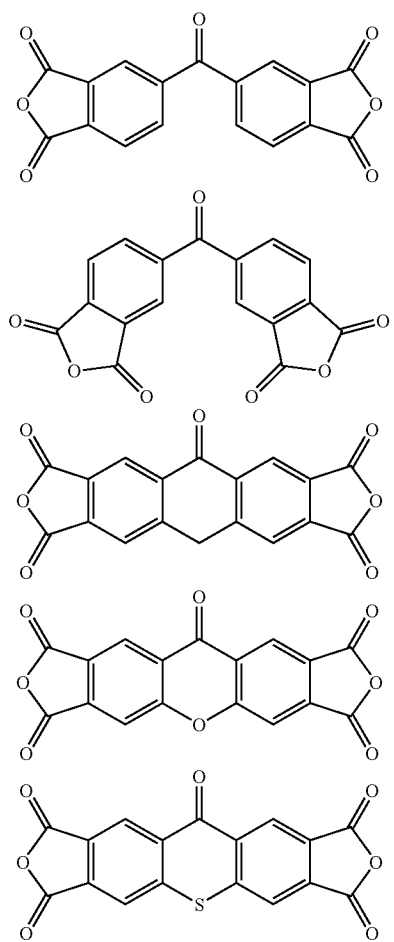

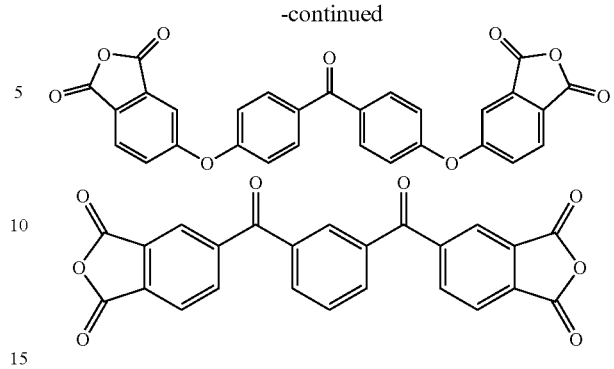

Diamine Compound Represented by the General Formula (III)

As the diamine compound represented by the general formula (III), any diamine compound in which $R^2$ is selected from the aromatic group, the aliphatic group, the aromatic group mutually connected by the bridge member, and the group containing the structure having the polymerization initiating ability or the like can be used. Among them, it is particularly preferable that $R^2$ is the diamine compound which has the group containing the structure having the polymerization initiating ability.

The diamine compound represented by the general formula (III) may be used singly or in combination.

Specific examples of diamine compounds represented by the general formula (III) include m-phenylenediamine, p-phenylenediamine, benzidine, 4,4''-diamineterphenyl, 4,4-diaminoquaterphenyl, 4,4''-diaminodiphenyl ether, 4,4'-diamino diphenyl methane, diaminodiphenylsulfone, 2,2-bis (p-aminophenyl)propane, 2,2-bis(p-aminophenyl) hexafluoropropane, 1,5-diaminonaphthalene, 2,6-diaminonaphthalene, 3,3,-dimethylbenzidine, 3,3'-dimethoxybenzidine, 3,3'-dimethyl-4,4'-diaminodiphenyl ether, 3,3'-dimethyl-4,4'-diaminodiphenyl methane, 1,4-bis (p-aminophenoxy)benzene, 4,4'-bis(p-aminophenoxy)biphenyl, 2,2-bis(4-(p-aminophenoxy)phenyl)propane, and 2,3,5,6-tetraamino-p-phenylenediamine.

Examples of the structure having the polymerization initiating ability which constitutes the group containing the structure having the polymerization initiating ability represented by $R^2$ include (a) the aromatic ketones, (b) the onium salt compound, (c) the organic peroxide, (d) the thio compound, (e) the hexaaryl biimidazole compound, (f) the ketoxime ester compound, (g) the borate compound, (h) the adinium compound, (i) the active ester compound, (j) the compound having the carbon halogen combination, and (k) the pyridinium compound in the same manner as $R^1$ in the general formula (II).

When $R^2$ is the group containing the structure having the polymerization initiating ability, as a connection form of two amino groups existing in the general formula (III) and $R^2$, the amino group may be an aspect connecting to any place in the structure having the above polymerization initiating ability, and may be connected through the connection group.

In the structure having the polymerization initiating ability, (a) the aromatic ketones are particularly preferable from the view point of the heat resistant of the polyimide.

Although specific examples of (a) the aromatic ketones include the same example as specific examples listed in the general formula (II), the invention is not limited thereto.

Although, the diamine compounds which are represented by the general formula (III) and are the particularly preferable aspect, and in which $R^2$ is the group containing the structure having the polymerization initiating ability are shown below, the invention is not limited thereto.

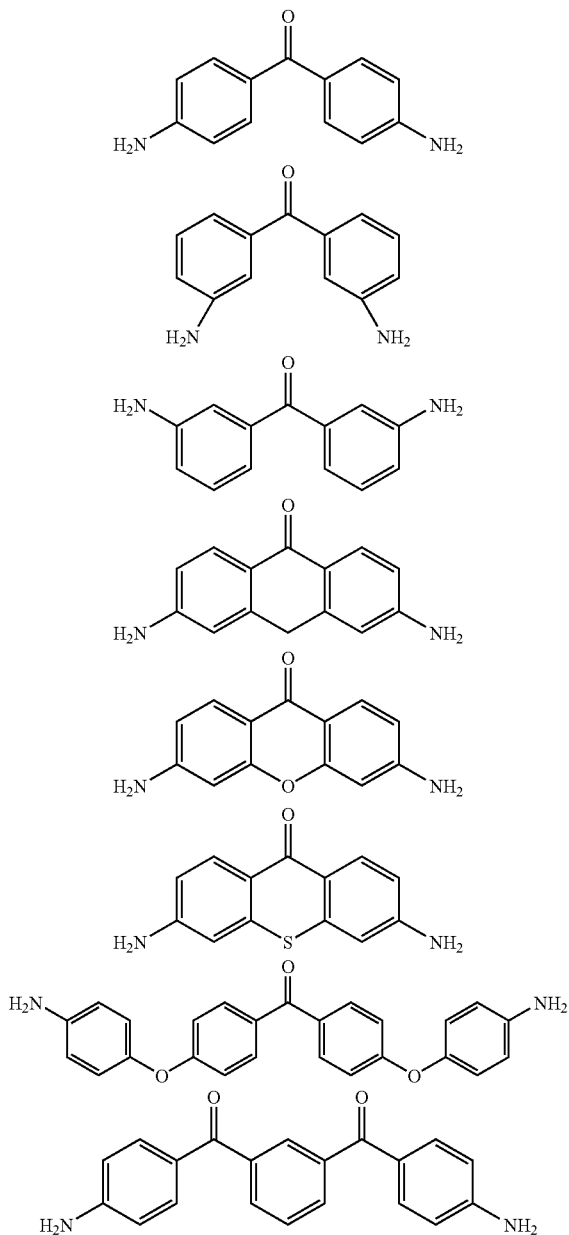

Synthesizing Method of the Compound Represented by the General Formula (I)

The compound which is a polyimide precursor compound and which is represented by the general formula (I) is synthesized by using tetracarboxylic acid dianhydride represented by the general formula (II), diamine compound represented by the general formula (III), and a dialcohol compound if desired.

Specifically, for example, the diamine compound represented by the general formula (III) is first dissolved in the solvent. The carboxylic acid dianhydride represented by the general formula (II) is then added, and below the freezing point, room temperature or the reaction temperature of 40 to 80° C. can be selected according to the used raw material to react.

Solvent

Although it is necessary to suitably select in consideration of the solubility of all ingredients etc. as the solvents used herein, the following solvent are particularly suitable.

Examples include ethylenedichloride, cyclohexanone, cyclopentanone, 2-heptanon, methyl isobutyl ketone, gamma-butyrolactone, methyl ethyl ketone, methanol, ethanol, dimethylimidazolidinone, ethylene glycol monomethyl ether, ethylene glycol monoethyl ether, ethylene glycol dimethyl ether, 2-methoxy ethyl acetate, ethylene glycol monoethyl ether acetate, propylene glycol monomethyl ether (PGME), propylene glycol monomethyl ether acetate (PGMEA), tetraethylene glycol dimethyl ether, triethylene glycol monobutyl ether, triethylene glycol monomethyl ether, isopropanol, ethylene carbonate, ethyl acetate, butyl acetate, methyl lactate, ethyl lactate, methyl methoxy propionate, ethyl ethoxypropionate, pyruvic acid methyl, pyruvic acid ethyl, pyruvic acid propyl, N,N-dimethylformamide, dimethylacetamide, dimethyl sulfoxide, N-methyl pyrrolidone, tetrahydrofuran, diisopropylbenzene, toluene, xylene, and mesitylene. These solvents are used singly or in combination.

Among them, particularly preferable examples of the solvents include propylene glycol monomethyl ether acetate, propylene glycol monomethyl ether, 2-heptanone, cyclohexanone, gamma-butyrolactone, ethylene glycol monomethyl ether, ethylene glycol monoethyl ether, ethylene glycol monoethyl ether acetate, propylene glycol monomethyl ether, propylene glycol monomethyl ether, ethylene carbonate, butyl acetate, methyl lactate, ethyl lactate, methyl methoxypropionate, ethyl ethoxypropionate, N-ethyl pyrrolidone, N,N-dimethylformamide, tetrahydrofuran, methyl isobutyl ketone, xylene, mesitylene and diisopropylbenzene.

The weight average molecular weight of the polyimide precursor compound represented by the general formula (I) is typically within the range of 1,000 to 10,000,000, and preferably about 1,000 to about 1,000,000. The weight average molecular weight is more preferably within the range of about 2,000 to about 1,000,000.

The content of the group containing the structure having the polymerization initiating ability contained as $R^1$ and/or $R^2$ in the polyimide precursor represented by the general formula (I) is preferably within the range of 10 mol % to 90 mol %, and more preferably 20 mol % to 90 mol % from the view point of the graft polymerization reaction carried out on the surface of the substrate.

<2> Forming of a Polyimide Precursor

The polyimide precursor is formed after above item <1>. Only the compound which is obtained by above item <1> and is represented by the general formula (I) as the used polyimide precursor may be used, and the polyimide precursor (compound which does not contain the group having the polymerization initiating ability) having other structure may be used together.

When a plurality of kinds of polyimide precursors are used, it is preferable that the content ratio of the compound represented by the general formula (D) in the whole polyimide precursor to the other polyimide precursor is 50 mass % or more, and more preferably 80 mass % or more.

Although the shape of the molded product is not particularly limited, it is preferable that the shape is film-like or tabular from the view point of adaptability for manufacture.

Molding Process

As the molding process, any technique can be also applied, and a biaxial drawing film molding, an injection molding, an extrusion molding, a hollow molding, a compression moulding, a FRP moulding, a hot moulding, a roll sheet moulding, a calendar moulding, a lamination moulding and a rotational molding can be applied. The polyimide precursor can be applied onto a glass substrate or the like and dried to mold in a film shape.

<3> Change of Polyimide Precursor to Polyimide Structure Due to Heat Treatment

The molded product of the polyimide precursor molded by the above item <2> is heated. The heat treatment is carried out by heating at 100° C. to 450° C. for 1 minute to 1 hour, and thereby, the structure of the compound (polyimide precursor) represented by the general formula (I) is changed to that of the polyimide represented by the following general formula (IV). Thus, the substrate containing the polyimide having the polymerization initiating moiety according to the invention in the skeleton can be obtained.

General Formula (IV)

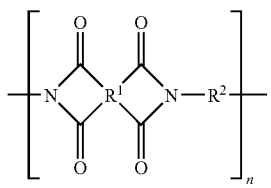

General formula (IV)

In the general formula (IV), $R^1$, $R^2$, n have the same meanings as $R^1$, $R^2$, n in the general formula (I), and the preferable range of the general formula (IV) have the same meanings as that of the general formula (I).

Hereinafter, specific examples of the compounds represented by the general formula (IV) are shown. However, the invention should never be limited thereto.

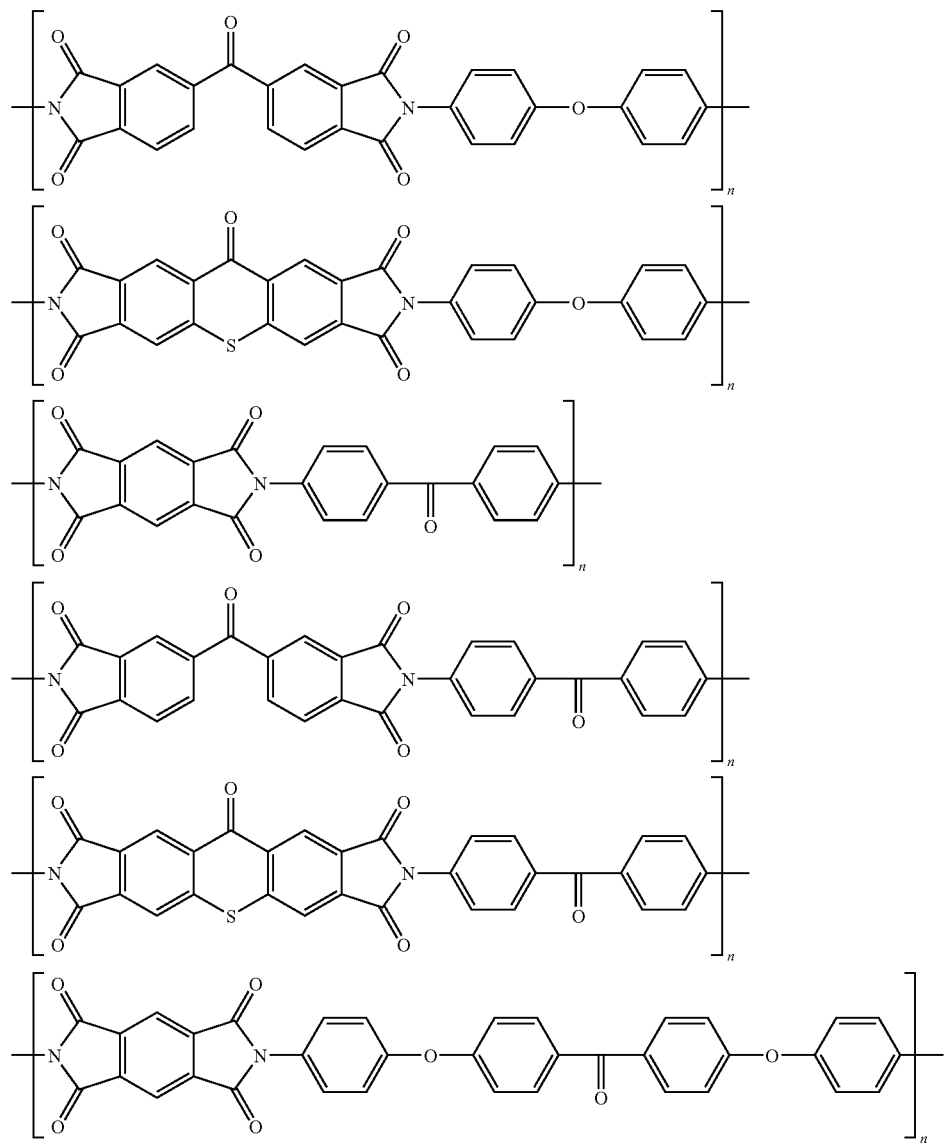

-continued

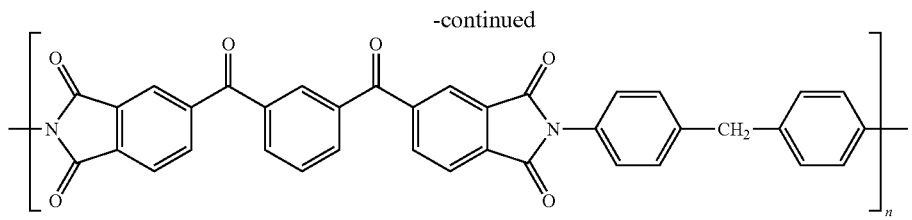

Surface Grafting of a Polyimide Substrate

In the method for forming the surface graft of the invention, energy is applied to the surface of the polyimide substrate obtained as described above, and active points are generated on the surface of the substrate. A graft polymer directly bonded to the surface of the substrate and having polar group is generated starting from the active points (surface graft polymerization).

Surface Graft Polymerization

In the method for forming the surface graft of the invention, the graft polymer (surface graft polymer) generated on the surface of the polyimide substrate is produced by using a means generally called surface graft polymerization.

A graft polymerization is a method for applying activated species on a chain of a polymer compound, polymerizing further another monomer which starts polymerization according to the application of the activated species, and synthesizing a graft polymer. When a polymer compound which applies particularly the activated species forms a solid surface, the situation is called a surface graft polymerization.

In the invention, the active points are generated on the substrate by contacting the compound having the polymerizable group and the polar group with the surface of the substrate containing the polyimide having the polymerization initiating moiety in the skeleton thereof explained above and applying energy. The active points, the polymerizable group of the compound and the substrate react to cause the surface graft polymerization reaction.

Although the contact may be carried out by immersing the substrate into a liquefied composition containing the compound having the polymerizable group and the polar group, as described later, it is preferable to form a layer contacting the composition containing the compound having the polymerizable group and the polar group as main ingredients on the surface of the substrate by a coating method, from the view point of handleability or manufacturing efficiency.

For example, when the film-like or tabular polyimide substrate is applied, the conductive film and the metal pattern formed by the method of the invention may be formed only on one surface of the substrate, and may be formed in both surfaces thereof.

Therefore, when the conductive film and the metal pattern are formed on both surfaces, the surface graft polymerization may be simultaneously carried out to both surfaces of the film-like or tabular polyimide substrate. Also, first, the surface graft polymerization may be carried out to one surface, and the surface graft polymerization may be then carried out to the other surface. Thus, when the surface graft layer is provided on the desired surface of the substrate and the plating process such as electroless plating to be described later is carried out, the conductive film is formed on the generation surface of the surface graft, and an etching process may be carried out if desired to form a metal pattern.

Compound Having a Polymerizable Group and a Polar Group

The compound which is used for the invention and has the polymerizable group and the polar group means a polymer obtained by introducing ethylene addition polymer unsaturated group (polymerizable group) such as a vinyl group, an allyl group and a (meta)acryl group as the polymerizable group to a homopolymer and a copolymer obtained by using at least one kind selected from the below monomer having the polar group or the monomer having the polymerizable group. The polymer has at least the polymerizable group at an end or a side chain.

EXAMPLE OF A MONOMER

Examples of the monomers which can be used include (meta)acrylic acid, the alkali metal salt thereof or the amine salt; itaconic acid, the alkali metal salt thereof, the amine salt or the styrene sulfonic acid salt; 2-hydroxy ethyl(meta)acrylate; (meta)acryl amide; N-monomethylol(meta)acryl amide; N-dimethylol(meta)acryl amide; allylamine or the hydrogen halide acid salt thereof; 3-vinyl propionic acid or the alkali metal salt thereof and the amine salt thereof; vinyl sulfonic acid or the alkali metal salt thereof and the amine salt; 2-sulfoethyl(meta)acrylate; polyoxyethylene glycol mono(meta)acrylate; 2-acryl amide 2-methyl propane sulfonic acid; acid phosphooxypolyoxyethylene glycol mono(meta)acrylate; N-vinyl pyrrolidone (the following structure); sodium styrenesulfonate; and vinyl benzoic acid. Generally, monomers having a functional group such as a carboxyl group, a sulfonic acid group, a phosphate group, an amino group or the salt thereof, a hydroxyl group, an amide group, a phosphine group, an imidazole group, a pyridine group or the salt thereof, and an ether group can be used.

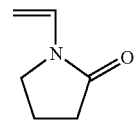

Polymer Having a Polymerizable Group and a Polar Group

The polymers having the polymerizable group and the polar group can be synthesized as follows.

Examples of the synthetic methods include (i) a method for copolymerizing a monomer having the polar group with a monomer having the polymerizable group, (ii) a method for copolymerizing a monomer having the polar group with the monomer having a double bond precursor, and introducing a double bond by the processing of a base or the like, and (iii) a method for reacting a polymer having the polar group with a monomer having the polymerizable group. From the view point of adaptability for synthesis, (iii) the method for copolymerizing the monomer having the polar group with the monomer having the polymerizable group and introducing the polymerizable group, (ii) the method for copolymerizing the monomer having the polar group with the monomer having the double bond precursor, and introducing the double bond by the processing of the base or the like are preferable.

Examples of the monomers which are used for synthesizing the polymer having the polymerizable group and the polar group in the method of above item (iii) and have the polar group include the monomers which having functional groups such as a carboxyl group, a sulfonic acid group, a phosphate group, an amino group or the salt thereof, a hydroxyl group, an amide group, a phosphine group, an imidazole group, a pyridine group or the salt thereof, and an ether group such as (meta)acrylic acid or the alkali metal salt thereof and the amine salt; itaconic acid or the alkali metal salt thereof and the amine salt; 2-hydroxyethyl(meta)acrylate; (meta)acryl amide; N-monomethylol(meta)acryl amide, N-dimethylol (meta)acryl amide; allylamine or the hydrogen halide acid salt thereof; 3-vinyl propionic acid or the alkali metal salt thereof and the amine salt; vinyl sulfonic acid or the alkali metal salt thereof and the amine salt; 2-sulfoethyl(meta)acrylate; polyoxyethylene glycol mono(meta)acrylate; 2-acryl amide-2-methyl propane sulfonic acid; acid phosphooxy-polyoxyethylene glycol mono(meta)acrylate; and N-vinyl pyrrolidone (the following structure).

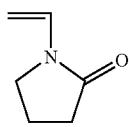

Examples of the monomers which copolymerize the monomer having the above polar group and have the polymerizable group include allyl(meta)acrylate and 2-allyloxyethyl-methacrylate. Examples of the monomers which are used in order to introduce an unsaturated group by using reaction of a functional group such as a carboxyl group, an amino group or the salt thereof, a hydroxyl group and an epoxy group in the polymer having the polar group and have the polymerizable group include (meta)acrylic acid, glycidy(meta)acrylate, allyl glycidyl ether and 2-isocyanatoethyl(meta)acrylate.

Next, (ii) the method for copolymerizing the monomer having the polar group with the monomer having the double bond precursor, and introducing the double bond by the processing of the base or the like will be described in detail. A technique described in Japanese Patent Application Laid-Open (JP-A) No. 2003-335814 can be used for the synthetic technique. As the monomer having the double bond precursor, compounds (i-1 to i-60) described in JP-A No. 2003-335814 can be used, and among them, the following compound (i-1) is particularly preferable.

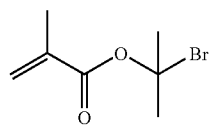

Base Used for Elimination Reaction

Preferable examples of the bases used when the double bond is introduced by the processing of the base or the like in the method of the item (ii) include a hydride, a hydroxide or a carbonate of alkaline metals, an organic amine compound and a metal alkoxide compound.

Preferable examples of the hydride, hydroxide or carbonate of the alkaline metals include sodium hydride, calcium hydride, potassium hydride, sodium hydroxide, potassium hydroxide, calcium hydroxide, potassium carbonate, sodium carbonate, potassium hydrogen carbonate and sodium hydrogen carbonate.

Preferable examples of organic amine compounds include trimethylamine, triethylamine, diethylmethylamine, tributylamine, triisobutylamine, trihexylamine, trioctylamine, N,N-dimethylcyclohexylamine, N,N-diethylcyclohexylamine, N-methyldicyclohexylamine, N-ethyldicyclohexyl amine, pyrrolidine, 1-methylpyrrolidine, 2,5-dimethylpyrrolidine, piperidine, 1-methylpyrrolidine, 2,2,6,6-tetramethylpyrrolidine, piperazine, 1,4-dimethylpiperazine, quinuclidine, 1,4-diazabicyclo[2,2,2]-octane, hexamethylene tetramine, morpholine, 4-methylmorpholine, pyridine, picoline, 4-dimethylamino pyridine, lutidine, 1,8-diazabicyclo[5,4,0]-7-undecene(DBU), N,N'-dicyclohexylcarbodiimide(DCC), diisopropylethylamine and Schiff base.

Preferable examples of the metal alkoxide compounds include sodium methoxide, sodium ethoxide and potassium t-butoxide. These bases may be used singly or in combination.

The amount of the base used may be the equivalence or less based on the amount of the specific functional group in the compound, and may be the equivalence or more.

The temperature condition in the elimination reaction may be room temperature, cooling or overheating. Preferable temperature condition is within the range of −20 to 100° C.

A macro monomer can also be used as the example of the compounds having the polymerizable group and the polar group.

As the manufacturing method of the macro monomer used in this case, for example, various kinds of processes are proposed in Chapter 2 "Synthesis of macro monomer", in "Chemistry and industry of macro monomer" (editor; Yuya Yamashita) issued by IBC publication office on Sep. 20, 1989. Examples of particularly useful macro monomers which can be used include a macro monomer derived from a carboxyl group containing-monomer such as acrylic acid and a methacrylic acid; a sulfonic acid system macro monomer derived from 2-acryl amide-2-methyl propane sulfonic acid, vinyl styrene sulfonic acid and the monomer of the salt thereof; an amide macro monomer derived from (meta)acryl amide, N-vinyl acetamide, N-vinyl formamide and N-vinyl carboxylic amide monomer; a macro monomer derived from a hydroxyl group containing-monomer such as hydroxyethyl methacrylate, hydroxyethyl acrylate and glycerol-monomethacrylate; and a macro monomer derived from an alkoxy group or an ethylene oxide group containing-monomer such as methoxyethyl acrylate, methoxy polyethyleneglycol acrylate and polyethyleneglycol acrylate. A monomer having a polyethyleneglycol chain or a polypropylene glycol chain can be also usefully used as the macro monomer used for the aspect.

The useful weight average molecular weight of the macro monomers is within the range of 250 to 100,000, and particularly preferably 400 to 30,000.

There are no particular limitations as long as a compound and a hydrophilic monomer or the like having the polymerizable group and the polar group as the main ingredients are dissolved in the solvent used for the composition containing the compound having the polymerizable group and the polar group. However, water solvents such as water and a water-soluble solvent are preferable, and a surface-active agent may be further added to the mixture thereof and the solvent.

Examples of the solvents which can be used include alcohol solvents such as methanol, ethanol, propanol, ethylene glycol, glycerin and propylene glycol monomethyl ether; acids such as acetic acid; ketone solvents such as acetone and cyclohexanone; and amide solvents such as formamide and dimethylacetamide.

The surface-active agent which can be added to the solvent if necessary should be dissolved in the solvent. Examples of the surface-active agents include anionic surface-active agents such as n-sodium dodecylbenzenesulfonate, cationic surface-active agents such as n-dodecyltrimethyl ammonium chloride, nonionic surface-active agents such as polyoxyethylene nonylphenol ether (as a marketed production, for example, Emulgen910, manufactured by Kao Corporation), polyoxyethylene sorbitan monolaurate (as a marketed production, for example, trade name; "Tween 20" or the like) and polyoxyethylene lauryl ether.

Although the graft polymer can be arbitrarily generated when the composition is contacted with the surface of the substrate with the composition liquefied, the coating amount when coating the composition to the surface of the substrate in the coating method is preferably within the range of 0.1 to 10 $g/m^2$ in terms of the solid contents from the view point of obtaining the enough coating film, and particularly preferably 0.5 to 5 $g/m^2$.

The film thickness of the graft film formed is preferably within the range of 0.1 to 2.0 $g/m^2$, more preferably 0.3 to 1.0 $g/m^2$, and most preferably 0.5 to 1.0 $g/m^2$. In the range, the conductive material, the metal ion, the electroless plating catalyst and the precursor thereof or the like to be described later can be sufficiently adsorbed, and the metal film having preferable conductivity can be obtained. Also, the excellent etching removal of the conductive ingredient in the etching process resulting from the high motility of the graft polymer chain can be attained.

Energy Application

As the energy application method for generating the active points at the polymerization initiating moiety existing on the surface of the polyimide substrate, for example, radiant ray irradiation such as heat and exposure can be used. The method for generating the active points includes light irradiation by an UV lamp and a visible light or the like, and heating by a hot plate or the like.

Examples of the light sources include a mercury lamp, a metal halide lamp, a xenon lamp, a chemical lamp and a carbon arc light. A g line, an i line, and a Deep-UV light are also used.

Although time required for energy application is different according to the generating amount of the graft polymer and the light source as the purpose, the time is typically within the range of 10 seconds to 5 hours.

As described above, the graft polymer can be generated on the surface of the polyimide substrate. A material (for example, a conductive material, a functional fine particle, a dye, a pigment or the like) which interacts with the polar group contained in the graft polymer existing on the surface is made to adhere to the surface of the substrate subjected to the surface graft by the method for forming the surface graft of the invention, and thereby, the material exhibiting various functions can be produced. Therefore, the method for forming the surface graft of the invention is applied to the wide range.

Particularly, the method can be suitably used for producing the material required for heat resistance. Particularly, the method for forming the surface graft of the invention is suitably applied to the method for forming the conductive film of the invention to be described later.

2. Surface Graft Material

The surface graft material of the invention is produced by using the above method for forming the surface graft of the invention, and has the substrate containing polyimide having the polymerization initiating moiety in the skeleton thereof and the graft polymer directly bonded to the surface of the substrate.

Since the surface of the polyimide substrate excellent in heat resistance is modified by the surface graft in the surface graft material of the invention, it is possible to make the material requiring heat resistance exhibit other various functions by making a material interacting with the polar group contained in the graft polymer adhere to the surface. It is particularly preferable that the surface graft material of the invention is applied as the conductive material of the invention to be described later.

3. Method for Forming a Conductive Film

Next, the method for forming the conductive film of the invention will be explained.

The method for forming the conductive film of the invention applies the above method for forming the surface graft of the invention to the method for forming the conductive film, and contains the following aspects (1) to (3).

(1) A first aspect contains a process (hereinafter, may be referred suitably to as "surface graft process") of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a polar group, and a process (hereinafter, may be referred suitably to as "conductive material adhesion process") of causing the conductive material to adhere to the graft polymer.

(2) A second aspect contains a process (hereinafter, may be referred suitably to as "surface graft process") of applying energy to the surface of a substrate containing polyimide having a polymerization initiating moiety in the skeleton thereof, to generate active points on the surface of the substrate and to generate a graft polymer that is directly bonded to the surface of the polyimide substrate starting from the active points and that has a polar group, a process (hereinafter, may be referred suitably to as "process of applying metal ion or the like") of applying a metal ion or a metal salt to the graft polymer, and a process (hereinafter, may be referred suitably to as "metal fine particle deposit process") of reducing the metal ion or a metal ion in the metal salt to deposit metal fine particles.

(3) A third aspect contains a process (hereinafter, may be referred suitably to as "surface graft process") of applying energy to the surface of a substrate containing polyimide having a polymerization initiating moiety in the skeleton thereof, to generate active points on the surface of the substrate and to generate a graft polymer that is directly bonded to the surface of the substrate starting from the active points and that has a functional group interacting with an electroless plating catalyst or the precursor thereof, a process (hereinafter, may be referred suitably to as "process of applying the electroless plating catalyst or the like") of applying the electroless plating catalyst or the precursor thereof to the graft polymer, and a process (hereinafter, may be referred suitably to as "electroless plating process") of carrying out electroless plating.

Hereinafter, the above aspects (1) to (3) will be sequentially explained.

3-1. Method for Forming a Conductive Film of the First Aspect

This aspect includes the surface graft process and the conductive material adhesion process. In the aspect, it is preferable to further perform a heating process after the conductive material adhesion process.

According to the aspect, a conductive film (conductive material adhesion film) which has high heat resistance and exhibits excellent adhesion and durability on the surface of a substrate can be formed on the surface of the polyimide substrate. Although the mechanism in the aspect is not clear, the mechanism is guessed as being the following.

That is, the graft structure (graft polymer), in which the graft polymer having the polar group is directly and chemically bonded, is formed on the surface of the polyimide substrate in the aspect. In the aspect, even if a mechanical operation such as wear is applied, the conductive film is not stripped from the substrate with the graft polymer, and thus the adhesion between the surface of the substrate and the conductive film can be improved in order to make the conductive material adhere to the graft polymer firmly connected with the surface of the substrate and thus form the conductive film. Moreover, the reason why the high heat resistant conductive film can also be formed is guessed to be that the polyimide substrate is used as the substrate.

In this aspect, conductivity can further be improved by carrying out a heating process after the conductive material adhesion process. The reason is guessed to be that the adhesion between the conductive materials is enhanced by fusion of the conductive materials generated by heating and by voids between the conductive materials decreasing.

Hereinafter, each process of the aspect will be explained in detail.

Surface Graft Process

The surface graft process in the aspect is a process corresponding to the method for forming the surface graft of the invention described above. The contents in explanation of the method for forming the surface graft will be similarly applied to the process.

Conductive Material Adhesion Process

In the process, the conductive material is adhered to the graft polymer generated by the surface graft process explained previously. The polar group of the compound having the polymerizable group and the polar group used in the surface graft process interacts with the conductive material.

Conductive Material

Although the conductive material should adhere to the polar group contained in the graft polymer according to the invention, particularly, the conductive fine particles can be preferably used.

There are no particular limitations as long as conductive fine particles which can be used for the aspect have conductivity, and fine particles made of a known conductive material can be arbitrarily and selectively used. Preferable examples of conductive fine particles include metal particles such as Au, Ag, Pt, Cu, Rh, Pd, Al and Cr; oxide semiconductor fine particles such as $In_2O_3$, $SnO_2$, ZnO, CdO, $TiO_2$, $CdIn_2O_4$, $Cd_2SnO_2$, $Zn_2SnO_4$ and $In_2O_3$—ZnO; fine particles obtained by doping the impurities applied thereto; spinel type compound fine particles such as MgInO and CaGaO; conductive nitride fine particles such as TiN, ZrN and HfN; conductive boride fine particles such as $LaB$; and conductive polymer fine particles as organic materials. An organic component as a dispersing agent may adhere to the particles.

(Relationship Between the Kind of Polar Group and Conductive Particles)

When the graft polymer generated by the above surface graft process has an anionic property such as a carboxyl group, a sulfonic acid group or a phosphonic acid group, the graft polymer generation part has a negative electric charge, and the conductive film is formed by making (cationic) conductive fine particles having a positive electric charge adhere thereto.

Examples of the cationic conductive fine particles include metal (oxide) fine particles having positive charges. For example, fine particles having positive charges in the high density on the surface can be produced by methods of Toru Yonezawa et al., i.e., methods described in T. Yonezawa, Chemistry Letters., 1999 page 1061, T. Yonezawa, Langumuir 2000, Vol 16, 5218 and Toru Yonezawa, Polymer preprints, Japan vol. 49. 2911 (2000). Yonezawa et al. uses metal-sulfur combination, and shows that metal particle surface chemically modified in the high density by the functional group having positive charges can be formed.

On the other hand, when the graft polymer generated has a cationic group such as an ammonium group described in Japanese Patent Application Laid-Open (JP-A) No. 10-296895, the graft polymer generation part has positive electric charges. The conductive film is formed by making the conductive particles having negative electric charges adhere thereto. Examples of the metal particles negatively charged include gold or silver particles obtained by citrate reduction.

It is preferable that the particle diameter of the conductive fine particles is within the range of 0.1 nm to 1000 nm from the view point of the intensity of conductive performance, heating fusion power and conductive region, and more preferably 1 nm to 100 nm.

It is preferable that the maximum amount of the above conductive particles which can adhere to the polar group (hydrophilic group) contained in the graft polymer is connected from the view point of durability. It is preferable that the dispersion concentration of a dispersion solution is within the range of about 0.001 to about 20 mass % from the view point of conductivity.

Examples of methods for making the conductive particles adhere to the hydrophilic group include a method for applying a solution in which the conductive particles having the charged surface are dissolved or dispersed to the surface on which the graft polymer is generated, and a method for immersing the substrate on which the graft polymer is generated in the solution or the dispersion solution. Since the conductive particles of the excessive amount are supplied in any case of the application and the immersion, and the sufficient ionic bond between the conductive particle and the hydrophilic group is introduced, it is preferable that the contact time of the solution or the dispersion solution and the pattern formation material surface is about 10 seconds to about 24 hours, and more preferably 1 minute to about 180 minutes.

In the aspect, not only one kind of the conductive particles but also a plurality of kinds of the conductive particles can be used together if necessary. A plurality of materials can be also used by mixing previously so as to obtain the desired conductivity.

Heating Process

In the aspect, it is preferable to perform the heating process further after the conductive material adhesion process. Fusion is generated between the adhered conductive materials by carrying out the heating process, and the adhesion between the conductive materials can be enhanced, and the conductivity can also be risen. Particularly, when the conductive material is the conductive particles, even if the conductive particles adhere in the coarse state, the adhesion between the conductive particles is improved by the fusion of the mutual conductive particles through the heating process, and the void between the conductive particles is decreased. Thereby, it is possible to express excellent conductivity. Herein, the temperature of the heating process is preferably within the range of 50° C. to 100° C., more preferably 100° C. to 300° C., and particularly preferably 150° C. to 300° C.

3-2. Method for Forming a Conductive Film of the Second Aspect

The aspect has the surface graft process, the process of applying the metal ion or the like and the metal fine particle deposit process.

In the aspect, it is preferable to perform the heating process further after the metal fine particle deposit process.

According to the aspect, the conductive film (metal fine particle dispersed film) which has the high heat resistance and exhibits excellent adhesion property and durability to the surface can be formed on the surface of the polyimide substrate. Although the mechanism in this aspect was not clear, the mechanism is guessed as follows.

That is, the graft structure (graft polymer) in which the graft polymer having the polar group is directly and chemically bonded is formed on the surface of the polyimide substrate in the aspect. In the aspect, the metal ion or the metal salt is applied to the graft polymer firmly connected with the surface of the substrate, and the metal fine particles are deposited by reducing the metal ion or the metal ion in the metal salt. Thereby, the conductive film (gold particle dispersing film) in which the metal fine particles adhere to the graft pattern is formed. Thereby, the conductive film is not stripped from the substrate with the graft polymer, and the adhesion property between the surface of the substrate and the conductive film can be improved. The reason why the high heat resistant conductive film can be also formed will be because the polyimide substrate is used as the substrate.

In the aspect, the conductivity can be further improved by carrying out the heating process after the metal particle deposit process. The reason will be because the adhesion between the metal fine particles is improved by the fusion of the metal fine particles generated by heating and the void between metal fine particles is decreased, and thereby forming the uniform metal film.

Hereinafter, each process of the aspect will be explained in detail.

Surface Graft Process

The surface graft process of the aspect is a process corresponding to the method for forming the surface graft of the invention described above. The contents in explanation of the method for forming the surface graft are similarly applied to the process.

Process of Applying Metal Ion or the Like

In the process, the metal ion or the metal salt is applied to the generated graft polymer after the above surface graft process. Further, the metal ion or the metal ion in the metal salt is reduced, and the conductive film (a metal thin film or metal particle adhesion film) is formed. The polar group of the compound having the polymerizable group and the polar group used in the surface graft process interacts with the metal ion or the metal salt.

In the process, a method for applying the metal ion or the metal salt can be suitably selected by the polar group contained in the generated graft polymer. Specifically, any of the following three methods can be suitably and selectively used. (1) A method for making the metal ion adhere to the graft polymer when the graft polymer has an acid group: (2) A method for impregnating the graft polymer with the metal salt or the solution containing the metal salt when the graft polymer has high affinity to the metal salt such as polyvinyl pyrrolidone: (3) A method for impregnating the hydrophilic region with the solution containing the metal ion and/or the metal salt by immersing the substrate on which the graft polymer is generated in the solution contained in the metal salt or the solution in which the metal salt is dissolved. It is particularly preferable that the method of the item (1) can introduce the metal ion into the graft polymer by the ionic bond.

Metal Ion and Metal Salt

Next, the metal ion and the metal salt will be explained.

In the aspect, there are no particular limitations as long as the metal salt is dissolved in a suitable solvent for applying to the graft polymer and is separated into a metal ion and a base (negative ion). Examples include $M(NO_3)_n$, $MCl_n$, $M_{2/n}(SO_4)$ $M_{3/n}(PO_4)$ (M represents an n-valent metal atom). The metal ion obtained by dissociating the above metal salt can be suitably used. Specific examples include Ag, Cu, Al, Ni, Co, Fe and Pd. Ag is preferably used as the conductive film, and Co is preferably used as the magnetic film.

The metal ion or the metal salt may be used singly or in combination if necessary. A plurality of materials may be also previously mixed so as to obtain the desired conductivity.

In the case of using the method for making the metal ion adhere to the graft polymer having the acid group, the metal ion or the metal salt may be applied to the graft polymer by applying the above metal salt having the shape of the fine particle directly, by adjusting a solution by using a solvent in which the metal salt is dispersed or is dissolved and coating the solution on the surface of the substrate on which the graft polymer exists, or by immersing the substrate having the graft polymer in the solution. The metal ion can ionicly adhere to the acid group by contacting the solution containing the metal ion. It is preferable that the metal ion concentration or metal salt concentration of the solution contacted is within the range of 1 to 50 mass %, and more preferably 10 to 30 mass % from the view point of making the adhesion perform fully. The contact time is preferably about 1 to about 24 hours.

In the case of using a method for impregnating the graft polymer with the metal salt or the solution containing the metal salt when the graft polymer has high affinity to the metal salt such as polyvinyl pyrrolidone, the metal ion or the metal salt may be applied to the graft polymer by applying the above metal salt having the shape of the fine particle directly, by adjusting a dispersion solution by using a suitable solvent in which the metal salt can be dispersed and coating the dispersion solution on the surface of the substrate on which the graft polymer exists, or by immersing the substrate having the graft polymer in the solution. Since the surface of the substrate is made of the graft polymer in the aspect, the water holding property is very high. The graft polymer can be impregnated with the dispersion solution in which the metal salt is dispersed by using the high water holding property. It is preferable that the metal salt concentration or metal salt concentration of the dispersion solution contacted is within the range of 1 to 50 mass % from the view point of the full impregnation of the dispersion solution, and more preferably 10 to 30 mass %. It is preferable that the contact time is within the range of about 1 to about 24 hours.

In the case of using a method for impregnating the graft polymer with the solution containing the metal salt and/or the metal salt by immersing the solution contained in the metal salt or the solution in which the metal salt is dissolved in the graft polymer, the metal ion or the metal salt may be applied to the graft polymer by adjusting a dispersion solution by using a suitable solvent in which the above metal salt can be dispersed, or by coating the dispersion solution or the solution obtained by dissolving the above metal salt in a suitable solvent and containing the separating metal ion on the surface of the substrate on which the graft polymer exists, or by immersing the substrate having the graft polymer in the solution. In the aspect, since the graft polymer is formed on the surface of the substrate in the method, the region on which the graft polymer is formed can be impregnated with the dispersion solution or the solution using a high water holding property. It is preferable that the metal salt concentration or metal salt concentration of the dispersion solution contacted is within the range of 1 to 50 mass % from the view point of the full impregnation of the dispersion solution, and more preferably 10 to 30 mass %. It is preferable that the contact time is within the range of about 1 to about 24 hours. Metal particle deposit process At the process, the metal ion or metal salt applied by the above process is reduced, and the metal fine particles are deposited.

Reducer

In the aspect, there are no particular limitations as long as a reducer used for reducing the metal salt or the metal ion existing so as to adhere to or impregnate with the graft polymer and forming a metal (particle) film reduces the used metal salt compound, and has the physical properties for depositing metal. Examples include hypophosphite, tetrahydro borate salt and hydrazine.

These reducers can be suitably selected by the relationship between the metal salt and the metal ion to be used. For example, when silver nitrate aqueous solution or the like is used as a metal salt aqueous solution supplying the metal ion and the metal salt, tetrahydro borate salt is suitably used. When an aqueous solution of palladium dichloride is used, hydrazine is suitably used.

Examples of the methods for adding the above reducer include the following two methods. In a first method, after the metal ion and the metal salt are applied to the surface of the substrate on which the graft polymer exists, the surface is washed, and the excessive metal salt and metal ion are removed. The substrate provided with the surface is immersed in water such as ion exchanged water, and the reducer is added thereto. In a second method, a reducer aqueous solution having a predetermined concentration is directly coated or dropped on the surface of the substrate. It is preferable to use the reducer of an excessive amount of an equivalent or more to the metal ion, and more preferably 10 times equivalents or more.

Although the existence of the uniform metal (particle) film having high strength due to the addition of the reducer can be visually checked from the metal luster of the surface, the structure can be checked by observing the surface using a transmission electron microscope or an AFM (atomic force microscope). The film thickness of the metal (particle) film can be easily measured by a method for observing a cutting plane by a conventional means, for example, an electron microscope.

Relationship Between the Kind of Polar Group (Hydrophilic Group) and the Metal Ion or the Metal Salt When the graft polymer generated has an anionic property such as a carboxyl group, a sulfonic acid group or a phosphonic acid group, the graft polymer has negative electric charges, and a metal (fine particle) film region is formed by making the metal ion having positive electric charges adhere to the graft polymer.

On the other hand, when the graft polymer obtained has a cationic group such as an ammonium group described in Japanese Patent Application Laid-pen (JP-A) No. 10-296895, the graft polymer has positive electric charges. A metal (fine particle) film region is formed by impregnating the graft polymer with the solution containing metal salt or the solution in which metal salt is dissolved, and by reducing the metal ion or the metal ion contained in the metal salt in the solution.

It is preferable that the maximum amount of the metal ion which can be applied to the polar group (hydrophilic groups) contained in the graft polymer is connected in view of durability.

The conductive film produced in the invention is compactly dispersed in the surface graft film as determined through surface observation and section observation using SEM and AFM. The size of the metal fine particles produced is within a range of 1 μm to 1 nm.

Heating Process

In the aspect, it is preferable to perform the heating process further after the metal particle deposit process.

The heating temperature of the heat treatment process is preferably 100° C. or more, more preferably 150° C. or more, and particularly preferably about 200° C. The heating temperature is preferably 400° C. or less in consideration of the processing efficiency and the dimensional stability of the substrate or the like. The heating time is preferably 10 minutes or more, and more preferably within the range of 30 minutes to 60 minutes. Although the operation mechanism due to the heat treatment was not clear, the conductivity is improved since the metal fine particles closing fuse mutually.

3-3. Method for Forming a Conductive Film of the Third Aspect

This aspect includes the surface graft process, the process of applying the electroless plating catalyst or the like, and the electroless plating process.

According to the aspect, a conductive film (metal film) which has high heat resistance and exhibits excellent adhesion and durability on the surface of a substrate can be formed on the surface of the polyimide substrate. Although the mechanism in this aspect is not clear, the mechanism is guessed as being the following.

That is, the surface graft process is carried out on the surface of the polyimide substrate in this aspect, and the electroless plating catalyst or the precursor thereof is made to act on the surface graft layer. When electroless plating is carried out, since the graft polymer chain is formed by polymerization from the substrate interface, the graft polymer chain is firmly adsorbed to the surface. Also, the graft polymer chain has a high motility, and the graft polymer chain tends to act with the electroless plating catalyst or the precursor thereof. Also, the electroless plating solution easily permeates to within the film due to the high motility, and the electroless plating advances in the surface graft layer, the upper portion, etc. As a result, the substrate interface of the metal film portion is in a hybrid state with the polymer directly bonded to the substrate, which is thought to express the excellent adhesion. In addition, since a polyimide substrate is used as the substrate, it is guessed that this has allowed a high heat resistant conductive film to also be formable.

Hereinafter, each process of the aspect will be explained in detail.

Surface Graft Process

The surface graft process in the aspect is a process corresponding to the method for forming the surface graft of the invention described above. The contents in explanation of the method for forming the surface graft are similarly applied to the process. The term "functional group which interact with the electroless plating catalyst or the precursor thereof" in the aspect has the same meanings as the term "polar group" contained in the graft polymer explained in the method for forming the surface graft.

Process of Applying Electroless Plating Catalyst or the Like

In the process, the electroless plating catalyst or the precursor thereof is applied to the graft polymer generated in the above surface graft process.

Electroless Plating Catalyst

The electroless plating catalyst used in the process is mainly zero valence metal, and examples thereof include Pd, Ag, Cu, Ni, Al, Fe and Co. In the invention, particularly, Pd and Ag are preferable from the excellent handleability and the high catalyst power. For example, a technique for applying metal colloid in which charge is adjusted so as to interact with the interactive group in the interaction region to the interaction region is used as a technique for fixing a zero valence metal to an interaction region. Generally, the metal colloids can be produced by reducing the metal ion in a solution in which a surface-active agent having charges or a protecting agent having charge exist. The charge of the metal colloid can be adjusted by the surface-active agent or protecting agent used herein. Thus, the metal colloid (electroless plating catalyst) can be made to adhere to the graft polymer by interacting the metal colloid in which the charge is adjusted with the interactive group (polar group) contained in the graft polymer.

Electroless Plating Catalyst Precursor

There are no particular limitations as long as the electroless plating catalyst precursor used in the process can become the electroless plating catalyst according to the chemical reaction. The metal ion of the zero valence metal used in the above electroless plating bath catalyst is mainly used. The metal ion which is the electroless plating catalyst precursor becomes the zero valence metal which is the electroless plating catalyst according to the reduction reaction. The metal ion which is the electroless plating catalyst precursor may be changed to zero valence metal by the reduction reaction separately to be the electroless plating catalyst before the immersion to the electroless plating bath after applied to the substrate. Also, the metal ion may be immersed in the electroless plating bath with the electroless plating catalyst precursor to be changed to the metal (electroless plating catalyst) by the reducers in the electroless plating bath.

In fact, the metal ion which is the electroless plating precursor is applied to the graft polymer in a state of the metal salt. There are no particular limitations as long as the metal salt used is dissolved in a suitable solvent and is separated into a metal ion and a base (negative ion). Examples include $M(NO_3)_n$, $MCl_n$, $M_{2/n}(SO_4)M_{3/n}(PO_4)$ (M represents an n-valent metal atom). The metal ion obtained by separating the above metal salt can suitably be used. Specific examples include an Ag ion, a Cu ion, an Al ion, a nickel ion, a Co ion, a Fe ion and a Pd ion, and the Ag ion and the Pd ion are preferable in view of catalyst power.

Examples of the method for applying the metal colloid which is the electroless plating catalyst, or the metal salt which is the electroless plating precursor to the graft polymer include the following method. The metal colloid is dispersed in a suitable dispersion medium, or the metal salt is dissolved in a suitable solvent. A solution containing the metal ion separated is prepared. The solution may be coated on the surface of the substrate on which the graft polymer exists, or the substrate having the graft polymer may be immersed in the solution. The metal ion is made to adhere to the interactive group contained in the graft polymer by contacting the solution containing the metal ion using an ion-ion interaction or an electric dipole-ion interaction, or the interaction region can be impregnated with the metal ion. It is preferable that the metal ion concentration or metal salt concentration of the solution contacted is within the range of 0.01 to 50 mass % from the view point of the full adhesion and impregnation, and more preferably 0.1 to 30 mass %. The contact time is preferably about 1 to about 24 hours, and more preferably about 5 minutes to about 1 hour.

Electroless Plating Process

In the process, a conductive film (metal film) is formed by carrying out electroless plating to the substrate to which the electroless plating catalyst is applied in the process of applying electroless plating catalyst or the like. That is, a high-density conductive film (metal film) is formed on the graft polymer obtained by the process by carrying out electroless plating in the process. The formed conductive film (metal film) has excellent conductivity and adhesion.

Electroless Plating

The electroless plating means an operation for depositing the metal by the chemical reaction using a solution in which the metal ion to be deposited as plating is melted.

In the electroless plating of the process, for example, the substrate to which the electroless plating catalyst obtained in the process for applying the electroless plating catalyst or the like is applied is washed, and the excessive electroless plating catalyst (metal) is removed. The substrate is then immersed in the electroless plating bath. A generally known electroless plating bath used can be used as the electroless plating bath.

When the substrate to which the electroless plating catalyst precursor is applied is immersed in the electroless plating bath in the state that the electroless plating catalyst precursor is made to adhere to the graft polymer, or is impregnated with the graft polymer, after the substrate is washed and the excessive precursor is removed (metal salt or the like), the substrate is immersed in the electroless plating bath. In this case, the precursor is reduced in the electroless plating bath, and the electroless plating is then carried out. A generally known electroless plating bath can be used in the same manner as the above as the electroless plating bath used herein.

As the composition of the general electroless plating bath, (1) the metal ion for plating, (2) the reducer and (3) the additive agent (stabilizer) for enhancing the stability of the metal ion are mainly contained. In addition to these, known additives such as the stabilizer of the plating bath may be contained in the plating bath.

As the kind of the metal used for the electroless plating bath, copper, tin, lead, nickel, gold, palladium and rhodium are known, and copper and gold are particularly preferable from the view point of conductivity. The optimal reducer and the additive exist according to the above metals. For example, the electroless plating bath of copper contains $Cu(SO_4)_2$ as copper salt, HCOH as a reducer, and chelating agents such as EDTA and roshell salt which are the stabilizer of copper ion as an additive agent. The plating bath used for the electroless plating of CoNiP contains cobalt sulfate and nickel sulfate as a metal salt; sodium hypophosphite as a reducer; and sodium malonate, sodium malate and sodium succinic acid as a complexing agent. The electroless plating bath of palladium contains (Pd $(NH_3)_4$) $Cl_2$ as the metal ion, $NH_3$, $H_2NNH_2$ as the reducer and EDTA a stabilizing agent. Ingredients other than the above ingredient may be contained in these plating baths.

Although the film thickness of the conductive film (metal film) formed as described above can be controlled by the metal salt or metal ion concentration of the plating bath, the immersion time to the plating bath or the temperature of the plating bath or the like, the film thickness is preferably 0.5 µm or more from the view point of conductivity, and more preferably 3 µm or more. The immersion time to the plating bath is preferably within the range of about 1 minute to about 3 hours, and more preferably about 1 minute to about 1 hour.

In the conductive film (metal film) obtained as described above, the sectional observation according to SEM confirms that the electroless plating catalyst and the fine particles of the plating metal are tightly dispersed in the surface graft layer and the comparatively larger particles are deposited thereon. Since the interface is in the hybrid state of the graft polymer and the fine particles, even if the difference of unevenness of the interface of the substrate (the organic ingredient) and the inorganic substance (the electroless plating catalyst or the plating metal) is 100 nm or less, the adhesion is excellent.

Electroplating Process

The aspect can contain a process (electroplating process) of electroplating after the electroless plating process. In the process, the metal film (conductive film) formed by the process can be used as an electrode after the electroless plating in the electroplating process, and electroplating can be further carried out. Thus, a metal film having an arbitrary thickness can be easily formed on the substrate by using the metal film which is excellent in adhesion with the substrate as a base. The thickness of the metal film corresponding to the purpose can be formed by adding the process, and it is suitable to apply the conductive material obtained by the aspect to various application.

As the method for electroplating of the aspect, conventional methods can be used. Examples of the metals used for the electroplating of the process include copper, chromium, lead, nickel, gold, silver, tin, zinc. Copper, gold and silver are preferable from the view point of conductivity, and copper is more preferable.

The film thickness of the metal film obtained by electroplating is different corresponding to various applications, and the film thickness can be controlled by adjusting the metal concentration, immersion time or current density or the like contained in the plating bath. The film thickness in the case of using for a general electric wiring or the like is preferably 0.3 µm or more, and more preferably 3 µm or more from the view point of conductivity.

For example, the electroplating process in the invention can be also carried out by electroplating for the purpose of applying to mounting of an IC or the like except for forming the patterned metal film having the thickness according to the purpose as described above. The plating carried out for this purpose can be carried out to the conductive film and the metal pattern surface formed by copper or the like by using a material selected from the group consisting of nickel, palladium, gold, silver, tin, solder, rhodium, platinum and these compounds.

Etching Process

The metal pattern excellent in adhesion with the substrate can be formed by applying the etching process to the conductive film (metal film) obtained as described above. As a method for etching in the case of forming a metal pattern by etching the conductive film obtained by the invention, "subtractive method" and "semiadditive method" are used.

"Subtractive Method"

The subtractive method indicates the following method. (1) A resist layer is coated on the conductive film produced by the above technique. (2) The resist pattern of a conductor which should be left is formed by pattern exposure and development. (3) The unnecessary conductive film is removed by etching. (4) The resist layer is stripped, and a metal pattern is formed. The film thickness of the conductive film used for the aspect is preferably 5 µm or more, and more preferably within the range of 5 to 30 µm.

(1) Resist Layer Coating Process

Resist

As a photosensitive resist to be used, a photosetting negative resist or a photofusing positive resist dissolved by exposure can be used. As the photosensitive resist, (1) a photosensitivity dry film resist (DFR), (2) a liquefied resist and (3) an ED (electrodeposition) resist can be used. These have characteristic respectively. (1) Since the photosensitivity dry film resist (DFR) can be used in a dry method, the photosensitivity dry film resist can be simply treated. (2) Since the liquefied resist film has a thin thickness as the resist, a pattern having sufficient resolution can be produced. (3) Since the ED (electrodeposition) resist has a thin film thickness as the resist, a pattern having sufficient resolution can be produced. Also, the follow-up to the unevenness of the coating surface is excellent, and the adhesion is excellent. The resist to be used may be suitably selected by considering these features.

Coating Method

1. Photosensitive Dry Film

The photosensitive dry film has a sandwich construction in which the photosensitive dry film is generally inserted between a polyester film and a polyethylene film, and is press-bonded by a heat roll, while the polyethylene film is removed by a laminater.

2. Liquefied Resist

Examples of the coating methods include a spray coat, a roll coat, a curtain coat and a dip coat. Among them, a roll coat and a dip coat can coat on both surfaces simultaneously for applying on both surfaces simultaneously.

3. ED (Electrodeposition) Resist

The ED resist is colloids obtained by suspending fine particles made of photosensitive resist in water. Since the particles are charged, when voltage is applied to the conductor layer, the resist is deposited on the conductor layer by electrophoresis. The colloids are mutually connected on the conductor to be in a membrane state.

(2) Pattern Exposure Process

"Exposure"

A substrate in which the resist film is provided on the upper part of the conductive film is stuck with a mask film or a dry plate, and exposed with the light of the sensitization region of the resist used. In the case of using the film, the substrate is stuck by a vacuous baking flame and is exposed. An exposure source having a pattern width of about 100 µm can be used as a point source. When pattern width having 100 µm or less is formed, it is preferable to use a parallel light source.

"Development"

The photosetting negative resist dissolving a non-exposure part, or any photofusing positive resist dissolved by exposure and dissolving an exposure part may be used. An organic solvent and an alkaline solution are mainly used, and an alkaline solution is used from environmental impact reduction in recent years.

(3) Etching Process

"Etching"

The etching is a process for dissolving the exposed metal layer which has no resist chemically to form a conductive pattern. In an etching process, the etching solution is mainly sprayed from the upper and lower sides on a horizontal conveyor. As the etching solution, a metal layer is dissolved and oxidized in an oxidizing solution. As the etching solution, a ferric hydrochloric acid solution, a cupric chloride solution and alkali etchant are used. Since the resist is stripped by alkali, the ferric hydrochloric acid solution and the cupric chloride solution are mainly used.

Since the substrate interface is not made uneven in the method of the invention, the removal property of the conductive ingredient near the substrate interface is excellent. Since the graft polymer introducing the conductive film on the substrate is connected with the substrate at the end of the polymer chain and has a structure having an extremely high motility, the etching solution can diffuse easily in the graft polymer layer in the etching process. In addition, the removal property of the metal component in the interface part between the substrate and the metal layer is excellent, the pattern having an excellent sharpness can be formed.

(4) Resist Stripping Process

"Stripping Process"

Since the etching resist which is unnecessary is unnecessary after a metal (conductivity) pattern is completed by etching, a process for stripping the etching resist is required. The etching resist can be stripped by spraying a stripping solution. Although the stripping solution is different according to the kinds of the resist, a solvent for generally swelling the resist or a solution is sprayed by a spray. The resist is swelled and stripped.

"Semiadditive Process"

In the semiadditive method, (1) a resist layer is coated on the conductive film formed on the graft polymer. (2) A resist pattern to be removed is formed by a pattern exposure and a development. (3) A conductive film is formed on the non-pattern part of the resist by plating. (4) A DFR is stripped. (5) A conductive film which is unnecessary is removed by etching. These processes can use the same technique as the "subtractive method". The electroless plating and electroplating explained above as the plating technique can be used. The film thickness of the conductive film used is preferably about 1 to about 3 μm in order to complete the etching process in a short time. The electrolytic plating and the electroless plating may be further carried out to the formed metal pattern.

Drilling Process

In order to form the multilayer wiring board using the metal pattern obtained by the method for forming the metal pattern of the invention, an opening such as a through hole via is provided on an insulating layer such as the substrate, and a plurality of metal wirings are electrically and mutually connected. In order to attain the high density of the circuit formed on one substrate by the metal pattern and the high density mounting of mounting parts, a drilling process may be further carried out. The drilling process is carried out for forming the through hole or the like in the insulating layer in a printed wiring board as a means for securing the electrical connection between layers. Since the multilayer the a circuit board is naturally also carried out such as forming circuit wiring on both surfaces of the substrate and laminating a plurality of substrates on which the circuit wiring is formed when the higher density of the circuit wiring and the high density of the mounting parts are attained.

In the drilling process, any method used for drilling such as a through hole at the time of producing a printed-circuit board can be also used. The detail such as the form and size of the hole formed can be suitably set.

As a processing method for forming the hole, a process method using a laser such as a drill process, a carbon dioxide laser currently used in recent years, an UV laser and an excimer laser can be also used. The laser process is extremely excellent in the way that extremely minute process can be carried out with high precision. Since smear may be left in the inner wall of a penetration hole when the laser process is carried out, it is preferable to remove the smear by chemical process and plasma polymerization or the like after the penetration hole is formed. However, when the material in which the metal pattern is formed by the invention is used as a TAB use, it is preferable to perform perforating process for mounting the IC using a drill.

In the method for forming the metal pattern of the invention, the drilling process may be carried out at any step. For example, the drilling process may be carried out after forming the metal pattern, and the drilling process may be carried out before the etching process after forming the conductive film.

Conductive Process

After the drilling process, the invention may comprise a process (conductive process) which performs conductive process to the hole formed by the above drilling process. The process may be carried out separately from the above other process, and the other process (the electroless plating process or the like) may serve as the process.

The conduction of the hole formed by the above drilling process in the conductive process is carried out by embedding the conductive material to the inside of the hole. Specific examples of the conductive materials include a metal simple substance such as copper, nickel, chromium, titanium, aluminum, molybdenum, tungsten, zinc, tin, indium, gold and silver, or such as a metal material these alloys (Nichrome or the like); a conductive polymer material such as polypyrrole and such as polythiophene; a nonmetal inorganic conductive material such as graphite and conductive ceramics.

Examples of the method for embedding the conductive material in the hole include an electroless plating method and a coating method is mentioned. This reason is because the electroless plating method and the coating method enable the formation of the conductivity comparatively uniformly and easily in a minute space such as the inside of the hole.

Specifically, for example, in the case of embedding the metal material in the hole and carrying out the conductive process, a catalyst is particularly suitably applied to the inside of the hole, and a chemical metal plating method (electroless plating method) is carried out. In the electroless plating process described above, when the electroless plating process is carried out to the graft polymer, the electroless plating is conveniently and simultaneously carried out.

In the case of embedding the inside of the hole with the conductive polymer material and carrying out conductive process, the electroless plating method and the coating method are used. After applying a suitable oxidizer to the inside of a hole in the electroless plating method, the substrate is immersed in a solution containing pyrrole or a thiophene monomer, for example, a pyrrole solution. In the applying method, a solution obtained by dissolving a conductive polymer such as polypyrrole and poly 1,4dioxythiophene in the solvent is used, the solution may be coated on the graft layer and the hole provided on the substrate.

When embedding the inside of the hole by non-metal inorganic conductive material such as graphite, and carrying out conductive process, an electroless plating method which do not use the catalyst is suitably used. If a graphite plating is explained as example, a laminated body may be immersed in a graphite dispersion solution, after processing the surface of the hole by using a pretreatment solution. As representative example of a graphite plating solution which can be used in the process, Direct Plating (registered trademark) which is a graphite plating solution manufactured by Meck is mentioned. The graphite plating solution contains a pretreatment solution (meck S process SP-6560) and a graphite dispersion solution (meck S process SP-6601) as a set.

Rustproof Process

In the invention, the rustproof process can be carried out to the metal pattern formed. As the rustproof process which can be applied to the invention, any rustproof process currently used at the time of producing a printed-circuit board can be typically used. For example, a method for plating zinc on a substrate, a method for applying flux, a method for applying a solder resist or the like can be used.

"Application of a Solder Resist"

The solder resist is a resin layer newly formed on the completed conductive pattern, and is formed as the purposes of (1) the prevention of adhesion of a solder, (2) the maintenance of insulation property between the conductors, (3) the protection of the conductor, (4) the improvement of electrical property and (5) the ground of the mold of packages such as BGA.

"Surface Treatment"

When various kinds of electronic components (IC chip or the like) are mounted on a printed wiring board, it is necessary to perform the surface treatment of a connected part. When the electronic components are connected to the printed wiring board by soldering, an HASL (solder coat) (1A), a precipitation type solder coating (1B), and a preflux (1C) process are carried out. For a connected part such as a wire bonding and a printed contact part, a nickel/gold plating (2A) is carried out.

1A. HASL

The HASL is a coating due to immersion, and the operation is carried out such that the surface in which the conductor base metal of a conductive pattern is exposed is protected and soldering property is excellent at the time of part mounting. First, in order to improve the adhesion of solder, flux is coated. The substrate is immersed in molten solder, and high-temperature and high-pressure air is sprayed to a panel from a nozzle when the substrate is pulled up, thereby removing excessive solder.

1B. Precipitation Type Solder Coat

When a paste using tin fine powder, an organic acid lead, rosin or the like is coated on the whole surface and is heated at 183° C. or more to generate a chemical reaction, and a tin/lead alloy is selectively on the conductor.

1C. Preflux

The preflux is a process for protecting the exposed surface of the conductor and having excellent solder wettability at the time of soldering. The preflux has compatibility which melts into the flux used at the time of soldering of parts easily, and protects such that the conductor surface before use is not oxidized.

2A. Nickel/Gold Plating

Nickel plating is carried out, and gold plating is carried out. Generally, a nickel plating of about 2 μm is deposited, and soft gold plating of 0.05 to 0.8 μm is deposited thereon. The gold plating can be used by a displacement plating and an electroless plating.

The surface treatment and surface shape of a conductive film (metal pattern) formed on the substrate often have an effect on the absorption of a carbon dioxide laser greatly when the process such as the drilling is carried out by the carbon dioxide laser. Thereby, the surface area may be increased by roughening the surface of the metal film using a CZ process or the like, and the absorption of the carbon dioxide laser may be increased. Herein, in the CZ process, specifically, after a substrate on which a metal film constituted by copper or the like is formed is immersed in the mixture of formic acid and hydrochloric acid, the substrate is washed, and a treating solution is washed away. The surface of the metal film is then roughened. The processing time is preferably 2 minutes or more and less than 10 minutes.

Hereinafter, the conductive materials obtained by the method for forming the conductive film of the invention and the method for forming the metal pattern will explained.

4. Conductive Material

The conductive material of the invention is produced by applying the method for forming the conductive film or method for forming the metal pattern method of the above invention. The conductive material has the substrate containing the polyimide having the polymerization initiating moiety in the skeleton thereof, the graft polymer existing on the surface of the substrate and directly bonded to the polymerization initiating moiety, and the conductive material adhering to the graft polymer.

The conductive material of the invention which is a firm, homogeneous conductive film is formed on the surface of the substrate without stripping from the surface of the substrate by the mechanical operation such as rubbing. Since the conductive material of the invention has high heat resistance, the conductive material is applied suitably for the various materials required for heat resistance. For example, the conductive material can be applied to a FPC board, a TAB tape, a semiconductor package and a rigid board circuit or the like, has wide range applications, and various setting according to the purpose can be carried out.

EXAMPLES

Hereinafter, the present invention will be explained in detail based on examples. However, the invention should never be limited thereto.

Example 1

Synthesis of a Polyimide Precursor (Polyamic Acid)

4,4'-diaminodiphenyl ether (5.75 g: 28.7 mmol) was dissolved in N-methyl pyrrolidone (30 ml) under nitrogen atmosphere, and the resultant solution was stirred for about 30 minutes at room temperature. To the solution, 3,3',4,4"-benzophenonetetracarboxylic acid dianhydride (9.25 g: 28.7 mmol) was added at 0° C., and the resultant solution was stirred for 5 hours. The reaction solution was reprecipitated and a polyimide precursor was obtained. The molecular weight (Mw) measured by GPC was 28,000. The structure was observed by $^1$H-NMR and FT-IR.

(Preparation of a Polyimide Film)

Polyamic acid synthesized by the above technique was dissolved in DMAc (manufactured by Wako Pure Chemical Industries, Ltd.) to prepare a solution of 20 wt %. The solution was coated on a glass substrate by using a rod bar #36, and was dried at 100° C. for 5 minutes. The solution was then heated at 250° C. for 30 minutes to solidify the solution, and a polyimide substrate (thickness of 15 μm) was obtained by removing the solidified product from the glass substrate.

(Preparation of Surface Graft Polymer)

A coating solution having the following composition was coated on the polyimide film produced by the above technique by using a rod bar #18. The film thickness of the film obtained was 0.8 μm. The obtained film was exposed to light for 10 minutes by using a 1.5 kW high-pressure mercury lamp. The film obtained was then washed by saturated sodium bicarbonate water, and a surface graft polymer was introduced into the whole substrate.

Composition of a Coating Solution
Polymerizable group containing polymer (the synthesizing method is shown below) 0.25 g
Cyclohexanone 8.0 g Synthesizing Method of the Above Polymerizable Group-Containing Polymer 2-hydroxyethyl methacrylate of 58.6 g was put into a three port flask of 500 ml. Acetone of 250 ml was then added to the flask and the resultant solution was stirred. After pyridine of 39.2 g and p-methoxy phenol of 0.1 g was added, the resultant solution was cooled in a water bath in which iced water was put. After the temperature of the mixture was 5° C. or less, 2-bromoisobutanoic acid bromide of 114.9 g was dropped for 3 hours by using a dropping funnel. After the dropping was completed, the water bath was removed and the mixture was further stirred for 3 hours. The reaction mixture was put in water of 750 ml, and was stirred for 1 hour. The water mixture was extracted 3 times by ethyl acetate of 500 ml by using a separating funnel. The organic layer was sequentially washed by 500 ml of hydrochloric acid of 1 mol/L, 500 ml of a saturated sodium bicarbonate solution, and 500 ml of a saturated salt solution. Magnesium sulfate of 100 g was put into the organic layer to dehydrate, dry and filtrate. The solvent was vacuum-distilled away, and a monomer A of 120.3 g was obtained.

Next, N,N-dimethylacetamide of 40 g was put into a three port flask of 1000 ml, and was heated under a nitrogen air current at 70° C. The monomer A of 12.58 g, methacrylic acid of 27.52 g and 40 g of a solution containing N,N-dimethylacetamide of V-601(trade name, manufactured by Wako Pure Chemical Industries, Ltd.) of 0.921 g were dropped for 2.5 hours. After the dropping was completed, the resultant solution was heated to 90° C., and was stirred for further 2 hours. After the reaction solution was cooled to room temperature, the reaction solution was put into water of 3.5 L, and a polymer compound was deposited. The polymer compound deposited was taken by filtering, and was washed by water and dried. Thereby, the polymer compound of 30.5 g was obtained. The weight average molecular weight of the polymer compound obtained was measured by a gel permeation chromatography method (GPC) in which polystyrene is the standard substance. As a result, the weight average molecular weight was 124,000.

The obtained polymer compound of 26.0 g in the three port flask of 200 ml and p-methoxyphenol of 0.1 g were put. The polymer compound was dissolved in N,N-dimethylacetamide of 60 g and acetone of 60 g, and was cooled in the water bath in which iced water was put. After the temperature of the mixture was 5° C. or less, 1,8-diazabicyclo[5.4.0]-7-undecene(DBU) of 60.4 g was dropped by the dropping funnel for 1 hour. After the dropping was completed, the ice bath was removed and was stirred for further 8 hours. The reaction solution was put into water of 2 L in which a concentrated hydrochloric acid of 17 ml was dissolved, and a polymerizable group containing polymer was deposited. The polymerizable group containing polymer deposited was taken by filtering, and was washed by water. The polymerizable group-containing polymer was then dried, and the polymer of 15.6 g was obtained.

(Electroless Plating)

After the obtained substrate was immersed in a solution containing palladium nitrate (manufactured by Wako Pure Chemical Industries, Ltd.) of 0.1 mass % for 1 hour, the substrate was washed by distilled water. The electroless plating was then carried out in an electroless plating bath of the following composition for 20 minutes, and a metal film (conductive film 1) was produced.

Composition of an Electroless Plating Bath
OPC copper H T1 (manufactured by Okuno Chemical Industries Co., Ltd.) 6 mL
OPC copper H T2 (manufactured by Okuno Chemical Industries Co., Ltd.) 1.2 mL
OPC copper H T3 (manufactured by Okuno Chemical Industries Co., Ltd.) 10 mL
Water 83 mL Example 2

The metal film formed in Example 1 was further electroplated for 15 minutes to produce a metal film 2.

Composition of an Electroplating Bath
Copper sulfate 38 g
Sulfric acid 95 g
Hydrochloric acid 1 mL
Coppergreen PCM (manufactured by Meltex) 3 mL
Water 500 mL Example 3

The polyimide substrate produced in Example 1 was immersed in a solution containing acrylic acid (10 wt %) and sodium periodate (NaIO$_4$, 0.01 wt %) under an argon atmosphere. The above high-pressure mercury lamp of 1.5 kW was used, and the polyimide substrate was irradiated with light for 10 minutes. The obtained layer was sufficiently washed by ion exchanged water after the light irradiation, and the surface graft polymer of acrylic acid was introduced onto the whole substrate to produce a graft layer.

Adhesion of a Conductive Material

The graft layer produced above was immersed in a positive charge Ag dispersion solution (the conductive material is produced by the following technique). Then, the surface was sufficiently washed in flowing water, and the excessive Ag dispersing-solution was removed. A conductive film 2 (conductive material adhesion film) to which the conductive material was adhered was produced.

Manufacturing Method of a Conductive Material

Bis(1,1-trimethyl ammoniumdecanoylaminoethyl)disulfide of 3 g was added to (5 mM) 50 ml of an ethanol solution of silver perchlorate. A sodium borohydride solution of 30 ml (0.4M) was slowly dropped under vigorous stirring, and ions were reduced. A dispersion solution containing silver particles covered with quaternary ammonium was obtained. When the size of the silver particle was measured by an electron microscope, the average particle diameter was 5 nm.

Example 4

A conductive film (conductive film 4) was produced by heating a conductive material adhesion film (conductive film 2) obtained in Example 3 at 300° C. for 1 hour.

Example 5

The polyimide substrate produced in Example 1 was immersed in a sodium styrenesulfonate (10 wt %) solution, and the substrate is irradiated with light for 10 minutes under an argon atmosphere by using the above high-pressure mercury lamp of 1.5 kW. The obtained layer was sufficiently washed by ion exchanged water after light irradiation, and the surface graft polymer of sodium styrenesulfonate was introduced onto the whole substrate, and a graft layer was produced.

Formation of a Metal Fine Particle Dispersed Film

After the graft layer (10 cm×10 cm) produced by the above technique was immersed in a solution of 15% by weight of silver nitrate (manufactured by Wako Pure Chemical Industries, Ltd.) for 12 hours, the graft layer was washed by distilled water. The substrate was then immersed in the distilled water of 100 mL. A uniform thin layer Ag metal fine particle dispersed film (conductive film 5) was formed on the surface of the substrate by dropping 30 mL of sodium tetrahydroborate of 0.2M.

Example 6

A conductive film (conductive film 6) was produced by heating the thin layer Ag metal fine particle dispersed film (conductive film 5) obtained in Example 5 at 300° C. for 15 minutes.

Evaluation

1. Evaluation of Conductivity

The surface conductivity of the obtained conductive films 1 to 6 were measured by a four probe method.

2. Adhesion Test

Aluminum plates (0.1 mm) were adhered on the surfaces of the obtained conductive films 1 to 6 by an epoxy-based agent (Araldite, manufactured by Ciba-Geigy). After drying at 140° C. for 4 hours, 90 degrees stripping experiment was carried out based on JISC6481.

3. Heat Resistance Test

After heating the obtained conductive films 1 to 6 at 200° C. for 2 hours, the appearances of the conductive films 1 to 6 were visually observed. The evaluation criteria is as follows.

A: no peeling of a metal film
B: peeling of a metal film

The above results are shown in the following Table 1.

TABLE 1

| | Conductive film No. | Surface resistance ($\square$/sq.) | Adhesion | Heat resistance |
|---|---|---|---|---|
| Example 1 | Conductive film 1 | 1.0 | 0.35 | A |
| Example 2 | Conductive film 2 | 0.01 | 0.30 | A |
| Example 3 | Conductive film 3 | 15 | 0.52 | A |
| Example 4 | Conductive film 4 | 1.1 | 0.50 | A |
| Example 5 | Conductive film 5 | 120 | 0.45 | A |
| Example 6 | Conductive film 6 | 15 | 0.43 | A |

Table 1 confirmed that the conductive films of Examples 1 to 6 are excellent in adhesion to the substrate, and have high heat resistance. The results of Examples 4, 6 confirmed that the conductivity of the conductive films obtained by the first and second aspects of the invention are further improved by carrying out a heating process.

Example 7

The same substrate as Example 1 was used, and the surface graft polymer was introduced in the same manner as Example 1. Further, the surface graft polymer was also introduced onto the rear surface in the same manner as Example 1. Electroless plating was then carried out in the same manner as Example 1, and metal films were formed on both surfaces of the polyimide substrate. Thereby, a metal film 7 (conductive film 7) was formed. When the surface resistance value of the conductive film 7 was measured in the same manner as Example 1, the surface resistance value of both surfaces were 1.0 $\square$/sq.

Example 8

Electroplating was carried out on the metal film 7 obtained in Example 7 on the same conditions by using the electroplating bath having the same composition as that of Example 2, and a metal film 8 (conductive film 8) having predetermined thickness on both surfaces of the polyimide substrate was formed. The surface resistance value of the conductive film 8 was measured in the same manner as Example 1, the surface resistance values of both surfaces were 0.01 $\square$/sq.

Example 9

Zinc plating for surface rustproof treatment was carried out on the conductive film 1 obtained in Example 1 for 1 minute according to the following conditions.

Composition of a Sulfate of Zinc Bath
Sulfric acid 70 g/L
Zinc 20 g/L (The liquid temperature of the plating bath: 40° C., the current density: 15 A/dm$^2$)

Example 10

A carbon dioxide laser processing machine was used for the conductive film 7 obtained in Example 7. The pulse energy of the laser was set to 60 mJ, and a through hole was formed (drilling). The above conductive film was then immersed in the following solution for 5 minutes.

Stannous chloride 10 g
Hydrochloric acid 40 mL
Water 1000 mL

Next, the conductive film was immersed in the following solution for 10 minutes.
Palladium chloride 0.1 g
Hydrochloric acid 1 mL
Water 1000 mL Finally, the inside of the through hole was plated by immersing the conductive film in the electroless plating solution used in Example 1 for 10 minutes. Then, electroplating was carried out for 15 minutes in the same manner as Example 2.

A photosensitive dry film (manufactured by Fuji Photo Film Co., Ltd.) was laminated on the conductive film obtained by the above technique, and ultraviolet light was exposed through a mask film on which a desired conductor circuit pattern was drawn. A picture was printed out, and a development was carried out. After copper (conductive film) of a non-conductor part was removed by using a cupric chloride etching solution, the dry film was stripped and a conductive pattern having a width of 70 μm was obtained. Thus, a double-sided wiring board on which the through hole produced by the drilling process and the conductive process of the hole exists in the metal pattern formed on both surfaces of the substrate was obtained.

Example 11

The through hole was formed (drilling), and the conductive processing of the hole was carried out by the electroless plating solution in the same manner as in Example 10. Electroplating was carried out for 3 minutes by the same method as that of Example 2.

A photosensitive dry film (manufactured by Fuji Photo Film Co., Ltd.) was laminated on the metal film 3 obtained, and ultraviolet light was exposed through a mask film (a metal pattern part is an opening and a metal pattern non-forming part is a mask part) on which a desired conductor circuit pattern was drawn. A picture was printed out, and a development was carried out.

Electroplating was carried out for the substrate on which the dry film was patternized for 15 minutes in the electroplating bath used in Example 1. After the dry film was stripped and copper (conductive film) of a metal pattern non-metal part was removed by using the cupric chloride etching solution, the metal pattern having a width of 25 μm (measured by an optical microscope, trade name: OPTI PHOTO-2, manufactured by Nikon Corporation) was obtained. When the surface resistance value of the metal pattern was measured in the same manner as Example 1, the surface resistance values of both surfaces were 0.01 □/sq. The adhesion and the heat resistance were similarly evaluated. The adhesion was 0.43 (kN/m), and the heat resistance was A level, that is, both were good.

Next, etching removal property was estimated according to the following criteria.

The non-metal pattern part was observed by a scanning electron microscope (SEM), and the presence or the absence of residual of the metal film was evaluated. The residual of the metal film was not observed, and removal property was good.

The invention claimed is:

1. A method for forming a surface graft, comprising the process of applying energy to the surface of a substrate containing polyimide represented by general formula (IV):

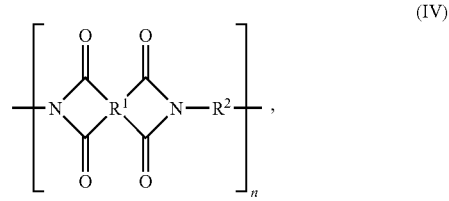

wherein $R^1$ represents a tetravalent organic group, $R^2$ represents a divalent organic group, n represents an integer of 1 or more, and at least one of $R^1$ and $R^2$ is a group containing a structure having a polymerization initiating ability, wherein the structure having a polymerization initiating ability is selected from the group consisting of an aromatic ketone, an onium salt compound, an organic peroxide, a thio compound, a hexaaryl biimidazole compound, a ketoxime ester compound, a borate compound, an adinium compound, an active ester compound, a compound having a carbon halogen bond, and a pyridinium compound, to generate active points on the surface of the substrate and to generate a graft polymer that is directly bonded to the surface of the substrate starting from the active points and that has a polar group.

2. The method for forming a surface graft of claim 1, wherein the energy is applied by ultraviolet light.

3. A method for forming a conductive film, comprising the processes of:
applying energy to the surface of a substrate containing polyimide represented by general formula (IV):

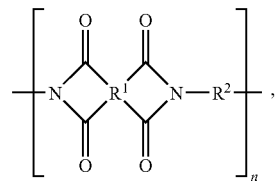

wherein $R^1$ represents a tetravalent organic group, $R^2$ represents a divalent organic group, n represents an integer of 1 or more, and at least one of $R^1$ and $R^2$ is a group containing a structure having a polymerization initiating ability, wherein the structure having a polymerization initiating ability is selected from the group consisting of an aromatic ketone, an onium salt compound, an organic peroxide, a thio compound, a hexaaryl biimidazole compound, a ketoxime ester compound, a borate compound, an adinium compound, an active ester compound, a compound having a carbon halogen bond, and a pyridinium compound to generate active points on the surface of the substrate and to generate a graft polymer that is directly bonded to the surface of the substrate starting from the active points and that has a polar group; and
causing a conductive material to adhere to the graft polymer.

4. The method for forming a conductive film of claim 3, further comprising the process of heating after the process of causing a conductive material to adhere to the graft polymer.

5. The method for forming a conductive film of claim 3, wherein the substrate has a film-like or tabular shape and wherein the conductive film is formed on both surfaces of the substrate.

6. A method for forming a metal pattern, comprising the process of etching the conductive film obtained by the method for forming a conductive film of claim 3.

7. A method for forming a multilayer wiring board which has, on a substrate, at least two metal layers that include the metal pattern obtained by the method for forming a metal pattern of claim 6 and an insulating layer disposed therebetween, comprising:
   a drilling process of forming an opening in the insulating layer; and
   a conductivity process of endowing conductivity to the opening, to connect at least two metal layers electrically.

8. The method for forming a conductive film of claim 3, wherein the energy is applied by ultraviolet light.

9. A method for forming a conductive film, comprising the processes of:
   applying energy to the surface of a substrate containing polyimide represented by general formula (IV):

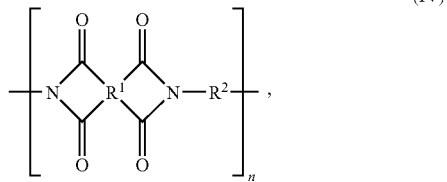

(IV)

wherein $R^1$ represents a tetravalent organic group, $R^2$ represents a divalent organic group, n represents an integer of 1 or more, and at least one of $R^1$ and $R^2$ is a group containing a structure having a polymerization initiating ability, wherein the structure having a polymerization initiating ability is selected from the group consisting of an aromatic ketone, an onium salt compound, an organic peroxide, a thio compound, a hexaaryl biimidazole compound, a ketoxime ester compound, a borate compound, an adinium compound, an active ester compound, a compound having a carbon halogen bond, and a pyridinium compound, to generate active points on the surface of the substrate and to generate a graft polymer that is directly bonded to the surface of the polyimide substrate starting from the active points and that has a polar group;
   applying a metal ion or a metal salt to the graft polymer; and
   reducing the metal ion or a metal ion in the metal salt to deposit metal fine particles.

10. The method for forming a conductive film of claim 9, further comprising the process of heating after the process of reducing the metal ion or the metal ion in the metal salt to deposit metal fine particles.

11. The method for forming a conductive film of claim 9, wherein the substrate has a film-like or tabular shape and wherein the conductive film is formed on both surfaces of the substrate.

12. A method for forming a metal pattern, comprising the process of etching the conductive film obtained by the method for forming a conductive film of claim 9.

13. A method for forming a multilayer wiring board which has, on a substrate, at least two metal layers that include the metal pattern obtained by the method for forming a metal pattern of claim 12 and an insulating layer disposed therebetween, comprising:
   a drilling process of forming an opening in the insulating layer; and
   a conductivity process of endowing conductivity to the opening, to connect at least two metal layers electrically.

14. The method for forming a conductive film of claim 9, wherein the energy is applied by ultraviolet light.

15. A method for forming a conductive film, comprising the processes of:
   applying energy to the surface of a substrate containing polyimide represented by general formula (IV):

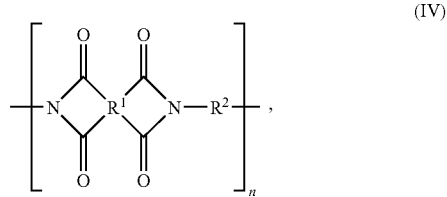

(IV)

wherein $R^1$ represents a tetravalent organic group, $R^2$ represents a divalent organic group, n represents an integer of 1 or more, and at least one of $R^1$ and $R^2$ is a group containing a structure having a polymerization initiating ability, wherein the structure having a polymerization initiating ability is selected from the group consisting of an aromatic ketone, an onium salt compound, an organic peroxide, a thio compound, a hexaaryl biimidazole compound, a ketoxime ester compound, a borate compound, an adinium compound, an active ester compound, a compound having a carbon halogen bond, and a pyridinium compound, to generate active points on the surface of the substrate, and to generate a graft polymer that is directly bonded to the surface of the substrate starting from the active points and that has a functional group interacting with an electroless plating catalyst or the precursor thereof;
   applying the electroless plating catalyst or the precursor thereof to the graft polymer; and
   carrying out electroless plating.

16. The method for forming a conductive film of claim 15, further comprising the process of carrying out electroplating after the process of carrying out electroless plating.

17. The method for forming a conductive film of claim 15, wherein the substrate has a film-like or tabular shape and wherein the conductive film is formed on both surfaces of the substrate.

18. A method for forming a conductive material having a metal pattern, wherein said method comprises the process of etching the conductive film obtained by the method for forming a conductive film of claim 15.

19. A method for forming a multilayer wiring board which has, on a substrate, at least two metal layers that include the conductive layer having said metal pattern obtained by the method for forming said conductive material as claimed in claim 18 and an insulating layer disposed therebetween, comprising:
   a drilling process of forming an opening in the insulating layer; and
   a conductivity process of endowing conductivity to the opening, to connect at least two metal layers electrically.

20. The method for forming a conductive film of claim 15, wherein the energy is applied by ultraviolet light.

* * * * *